United States Patent
Wloczysiak

(10) Patent No.: US 9,385,765 B2
(45) Date of Patent: Jul. 5, 2016

(54) DIVERSITY RECEIVER FRONT END SYSTEM WITH PHASE-SHIFTING COMPONENTS

(71) Applicant: SKYWORKS SOLUTIONS, INC., Woburn, MA (US)

(72) Inventor: Stephane Richard Marie Wloczysiak, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/734,759

(22) Filed: Jun. 9, 2015

(65) Prior Publication Data

US 2016/0127014 A1    May 5, 2016

Related U.S. Application Data

(60) Provisional application No. 62/073,043, filed on Oct. 31, 2014, provisional application No. 62/073,040, filed on Oct. 31, 2014, provisional application No. 62/073,039, filed on Oct. 31, 2014.

(51) Int. Cl.

| H04L 1/02 | (2006.01) |
|---|---|
| H04B 1/10 | (2006.01) |
| H03F 1/02 | (2006.01) |
| H03F 3/19 | (2006.01) |
| H03F 3/21 | (2006.01) |
| H04B 7/08 | (2006.01) |
| H03F 1/56 | (2006.01) |
| H04B 1/16 | (2006.01) |
| H04B 1/18 | (2006.01) |
| H04B 7/01 | (2006.01) |

(52) U.S. Cl.
CPC .............. *H04B 1/10* (2013.01); *H03F 1/0205* (2013.01); *H03F 1/56* (2013.01); *H03F 3/19* (2013.01); *H03F 3/211* (2013.01); *H04B 1/16* (2013.01); *H04B 1/18* (2013.01); *H04B 7/01* (2013.01); *H04B 7/08* (2013.01); *H03F 2200/451* (2013.01); *H03F 2203/21106* (2013.01)

(58) Field of Classification Search
CPC ............... H04B 7/01; H04B 1/18; H04B 7/08
See application file for complete search history.

(56) References Cited

U.S. PATENT DOCUMENTS

| 4,177,427 A * | 12/1979 | Shores ................. H03L 7/0812 375/260 |
|---|---|---|
| 5,644,272 A | 7/1997 | Dabrowski |
| 2004/0125902 A1* | 7/2004 | Nishimura ............ H03K 5/082 375/371 |
| 2005/0197095 A1 | 9/2005 | Nakamata |
| 2008/0055016 A1 | 3/2008 | Morris |
| 2008/0238569 A1 | 10/2008 | Matsuo |
| 2009/0093270 A1 | 4/2009 | Block |

(Continued)

*Primary Examiner* — Dac Ha
(74) *Attorney, Agent, or Firm* — Chang & Hale LLP

(57) ABSTRACT

Diversity receiver front end system with phase-shifting components. A receiving system can include a controller configured to selectively activate one or more of a plurality of paths between an input of the receiving system and an output of the receiving system. The receiving system can further include a plurality of amplifiers, each one of the plurality of amplifiers disposed along a corresponding one of the plurality of paths and configured to amplify a signal received at the amplifier. The receiving system can further include a plurality of phase-shift components, each one of the plurality of phase-shift components disposed along a corresponding one of the plurality of paths and configured to phase-shift a signal passing through the phase-shift component.

20 Claims, 14 Drawing Sheets

(56) References Cited

U.S. PATENT DOCUMENTS

| | | | |
|---|---|---|---|
| 2012/0128034 A1* | 5/2012 | Feher | H04W 64/00 375/133 |
| 2013/0003783 A1 | 1/2013 | Gudem | |
| 2013/0016633 A1 | 1/2013 | Lum | |
| 2013/0029624 A1 | 1/2013 | Bendsen | |
| 2013/0043946 A1 | 2/2013 | Hadjichristos | |
| 2013/0063223 A1 | 3/2013 | See | |
| 2013/0244722 A1 | 9/2013 | Rousu | |
| 2013/0273861 A1 | 10/2013 | See | |
| 2015/0207536 A1* | 7/2015 | Yehezkely | H03H 11/02 455/78 |
| 2015/0249479 A1* | 9/2015 | Nobbe | H04B 17/12 455/77 |
| 2015/0295597 A1* | 10/2015 | Wloczysiak | H04W 40/02 370/297 |
| 2015/0326206 A1* | 11/2015 | Nobbe | H03H 11/28 455/78 |
| 2015/0362583 A1* | 12/2015 | Ainspan | H01Q 3/28 342/361 |

\* cited by examiner

DIVERSITY RECEIVER FRONT END SYSTEM WITH PHASE-SHIFTING COMPONENTS

CROSS-REFERENCE TO RELATED APPLICATION(S)

This application claims priority to U.S. Provisional Application No. 62/073,043 filed Oct. 31, 2014, entitled DIVERSITY RECEIVER FRONT END SYSTEM, U.S. Provisional Application No. 62/073,040, filed Oct. 31, 2014, entitled CARRIER AGGREGATION USING POST-LNA PHASE MATCHING, and U.S. Provisional Application No. 62/073,039, filed Oct. 31, 2014, entitled PRE-LNA OUT OF BAND IMPEDANCE MATCHING FOR CARRIER AGGREGATION OPERATION, the disclosures of which are hereby expressly incorporated by reference herein in their entirety.

BACKGROUND

1. Field

The present disclosure generally relates to wireless communication systems having one or more diversity receiving antennas.

2. Description of the Related Art

In wireless communication applications, size, cost, and performance are examples of factors that can be important for a given product. For example, to increase performance, wireless components such as a diversity receive antenna and associated circuitry are becoming more popular.

In many radio-frequency (RF) applications, a diversity receive antenna is placed physically far from a primary antenna. When both antennas are used at once, a transceiver can process signals from both antennas in order to increase data throughput.

SUMMARY

In accordance with some implementations, the present disclosure relates to a receiving system including a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component.

In some embodiments, a first phase-shift component of the plurality of phase-shift components disposed along a first path of the plurality of paths corresponding to a first frequency band can be configured to phase-shift a second frequency band of a signal passing through the first phase-shift component such that a second initial signal propagated along a second path of the plurality of paths corresponding to the second frequency band and a second reflected signal propagated along the first path are at least partially in-phase.

In some embodiments, a second phase-shift component of the plurality of phase-shift components disposed along the second path can be configured to phase-shift the first frequency band of a signal passing through the second phase-shift component such that a first initial signal propagated along the first path and a first reflected signal propagated along the second path are at least partially in-phase.

In some embodiments, the first phase-shift component can be further configured to phase-shift a third frequency band of a signal passing through the first phase-shift component such that a third initial signal propagated along a third path of the plurality of paths corresponding to the third frequency band and a third reflected signal propagated along the first path are at least partially in-phase.

In some embodiments, the first phase-shift component can be configured to phase-shift the second frequency band of a signal passing through the first phase-shift component such that the second initial signal and the second reflected signal have a phase difference of an integer multiple of 360 degrees.

In some embodiments, the receiving system can further include a multiplexer configured to split an input signal received at the input into a plurality of signals at a respective plurality of frequency bands propagated along the plurality of paths. In some embodiment, the receiving system can further include a signal combiner configured to combine signals propagating along the plurality of paths. In some embodiments, the receiving system can further include a post-combiner amplifier disposed between the signal combiner and the output, the post-combiner amplifier configured to amplify a signal received at the post-combiner amplifier. In some embodiments, each one of the plurality of phase-shift components can be disposed between the signal combiner and a respective one of the plurality of amplifiers. In some embodiments, at least one of the plurality of amplifiers can include a dual-stage amplifier.

In some embodiments, at least one of the plurality of phase-shift components can be a passive circuit. In some embodiments, at least one of the plurality of phase-shift components can be an LC circuit.

In some embodiments, at least one of the plurality of phase-shift components can include a tunable phase-shift component configured to phase-shift a signal passing through the tunable phase-shift component an amount controlled by a phase-shift tuning signal received from the controller.

In some embodiments, the receiving system can further include a plurality of impedance matching components, each one of the impedance matching components disposed along a corresponding one of the plurality of paths and configured to decrease at least one of an out-of-band noise figure or an out-of-band gain of the corresponding one of the plurality of paths.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component.

In some embodiments, the RF module can be a diversity receiver front-end module (FEM).

In some embodiments, a first phase-shift component of the plurality of phase-shift components disposed along a first path of the plurality of paths corresponding to a first frequency band is configured to phase-shift the second frequency band of a signal passing through the first phase-shift component such that a second initial signal propagated along a second path of the plurality of paths corresponding to the second frequency band and a second reflected signal propagated along the first path are at least partially in-phase.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component. The wireless device further includes a transceiver configured to receive a processed version of the first RF signal from the output via a transmission line and generate data bits based on the processed version of the first RF signal.

In some embodiments, the wireless device can further include a second antenna configured to receive a second radio-frequency (RF) signal and a second FEM in communication with the first antenna. The transceiver can be configured to receive a processed version of the second RF signal from an output of the second FEM and generate the data bits based on the processed version of the second RF signal.

In some embodiments, a first phase-shift component of the plurality of phase-shift components disposed along a first path of the plurality of paths corresponding to a first frequency band is configured to phase-shift the second frequency band of a signal passing through the first phase-shift component such that a second initial signal propagated along a second path of the plurality of paths corresponding to the second frequency band and a second reflected signal propagated along the first path are at least partially in-phase.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/734,775, entitled DIVERSITY RECEIVER FRONT END SYSTEM WITH IMPEDANCE MATCHING COMPONENTS, filed on even date herewith and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Figure 1:
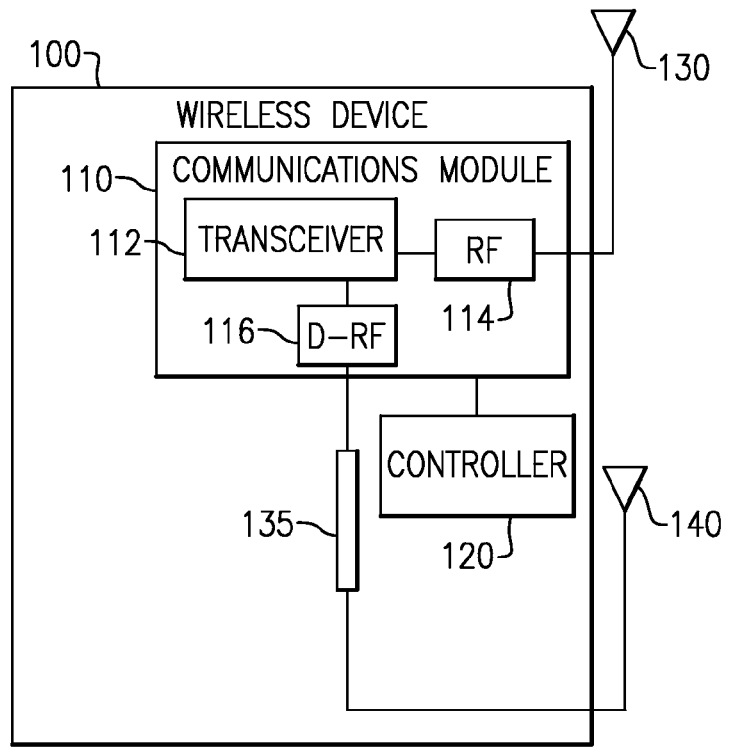
FIG. 1 shows a wireless device having a communications module coupled to a primary antenna and a diversity antenna.

FIG. 1 shows a wireless device 100 having a communications module 110 coupled to a primary antenna 130 and a diversity antenna 140. The communications module 110 (and its constituent components) may be controlled by a controller 120. The communications module 110 includes a transceiver 112 that is configured to convert between analog radio-frequency (RF) signals and digital data signals. To that end, the transceiver 112 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The communications module 110 further includes an RF module 114 coupled between the primary antenna 130 and the transceiver 112. Because the RF module 114 may be physically close to the primary antenna 130 to reduce attenuation due to cable loss, the RF module 114 may be referred to as front-end module (FEM). The RF module 114 may perform processing on an analog signal received from the primary antenna 130 for the transceiver 112 or received from transceiver 112 for transmission via the primary antenna 130. To that end, the RF module 114 may include filters, power amplifiers, band select switches, matching circuits, and other components. Similarly, the communications module 110 includes a diversity RF module 116 coupled between the diversity antenna 140 and the transceiver 112 that performs similar processing.

When a signal is transmitted to the wireless device, the signal may be received at both the primary antenna 130 and the diversity antenna 140. The primary antenna 130 and diversity antenna 140 may be physically spaced apart such that the signal at the primary antenna 130 and diversity antenna 140 is received with different characteristics. For example, in one embodiment, the primary antenna 130 and diversity antenna 140 may receive the signal with different attenuation, noise, frequency response, or phase shift. The transceiver 112 may use both of the signals with different characteristics to determine data bits corresponding to the signal. In some implementations, the transceiver 112 selects from between the primary antenna 130 and the diversity antenna 140 based on the characteristics, such as selecting the antenna with the highest signal-to-noise ratio. In some implementations, the transceiver 112 combines the signals from the primary antenna 130 and the diversity antenna 140 to increase the signal-to-noise ratio of the combined signal. In some implementations, the transceiver 112 processes the signals to perform multiple-input/multiple-output (MIMO) communication.

Because the diversity antenna 140 is physically spaced apart from the primary antenna 130, the diversity antenna 140 is coupled to the communications module 110 by a transmission line 135, such as a cable or a printed circuit board (PCB) trace. In some implementations, the transmission line 135 is lossy and attenuates the signal received at the diversity antenna 140 before it reaches the communications module 110. Thus, in some implementations, as described below, gain is applied to the signal received at the diversity antenna 140. The gain (and other analog processing, such as filtering) may be applied by a diversity receiver module. Because such a diversity receiver module may be located physically close to the diversity antenna 140, it may be referred to a diversity receiver front-end module.

Figure 2:
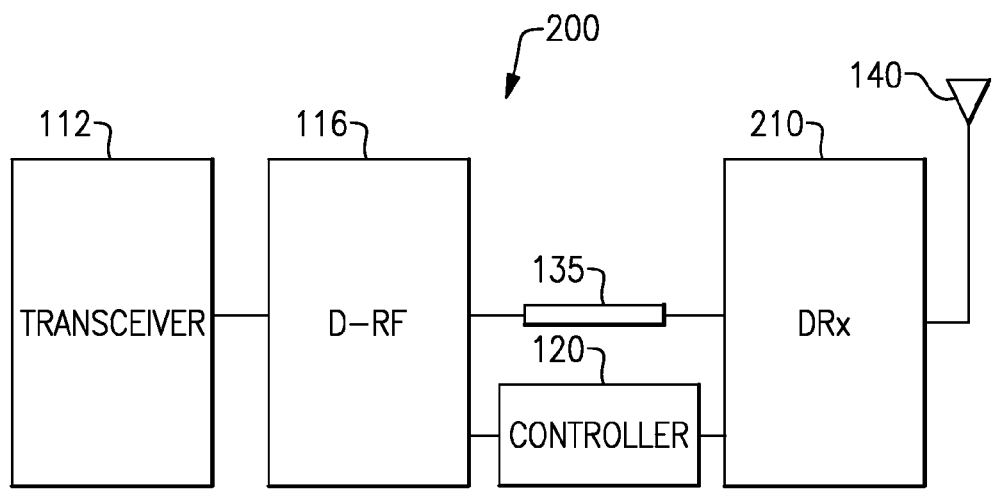
FIG. 2 shows a diversity receiver (DRx) configuration including a DRx front-end module (FEM).

FIG. 2 shows a diversity receiver (DRx) configuration 200 including a DRx front-end module (FEM) 210. The DRx configuration 200 includes a diversity antenna 140 that is configured to receive a diversity signal and provide the diversity signal to the DRx FEM 210. The DRx FEM 210 is configured to perform processing on the diversity signal received from the diversity antenna 140. For example, the DRx FEM 210 may be configured to filter the diversity signal to one or more active frequency bands, e.g., as indicated by the controller 120. As another example, the DRx FEM 210 may be configured to amplify the diversity signal. To that end, the DRx FEM 210 may include filters, low-noise amplifiers, band select switches, matching circuits, and other components.

The DRx FEM 210 transmits the processed diversity signal via a transmission line 135 to a downstream module, such as the diversity RF (D-RF) module 116, which feeds a further processed diversity signal to the transceiver 112. The diversity RF module 116 (and, in some implementations, the transceiver), is controlled by the controller 120. In some implementations, the controller 120 may be implemented within the transceiver 112.

Figure 3:
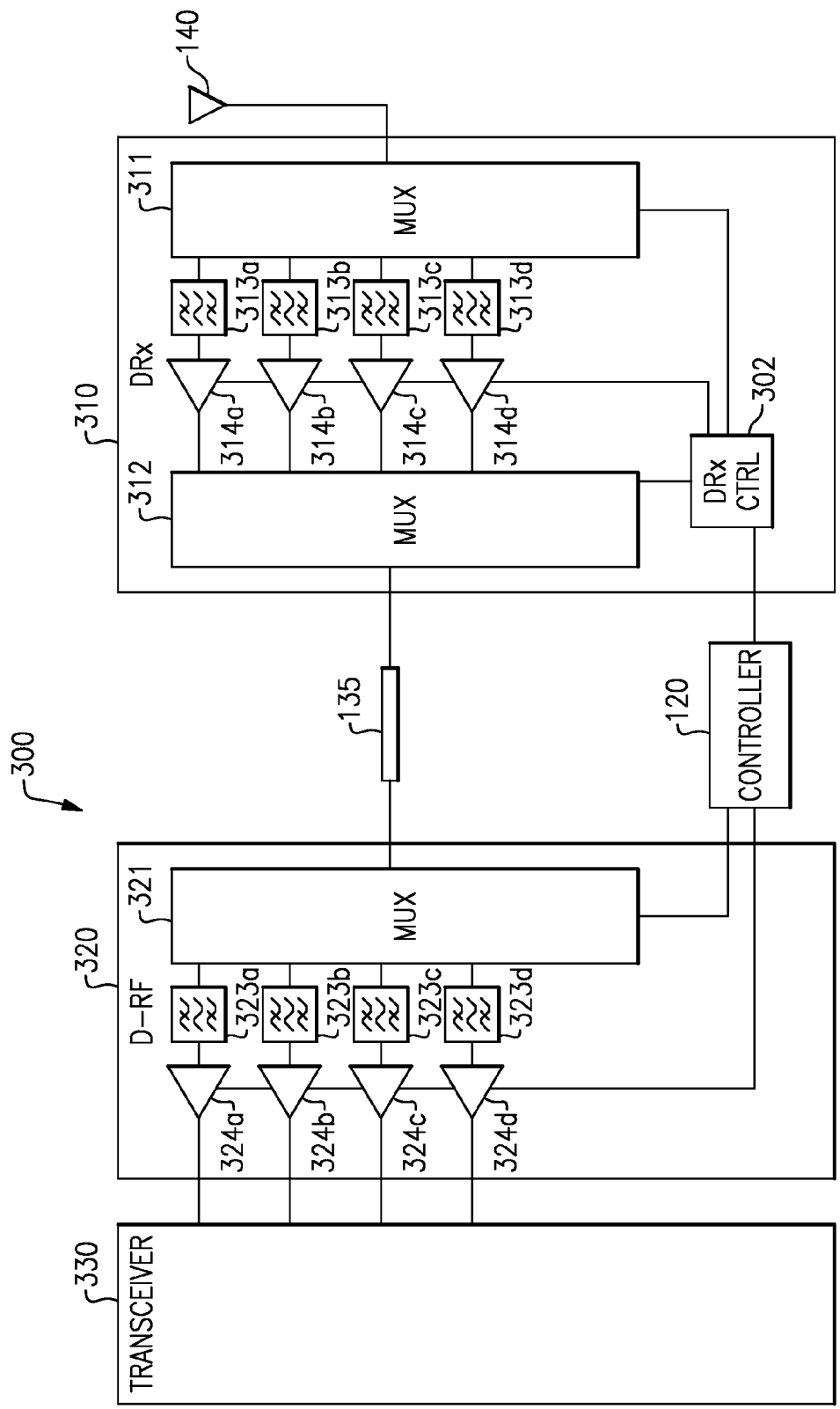
FIG. 3 shows that in some embodiments, a diversity receiver (DRx) configuration may include a DRx module with multiple paths corresponding to multiple frequency bands.

FIG. 3 shows that in some embodiments, a diversity receiver (DRx) configuration 300 may include a DRx module 310 with multiple paths corresponding to multiple frequency bands. The DRx configuration 300 includes a diversity antenna 140 configured to receive a diversity signal. In some implementations, the diversity signal may be a single-band signal including data modulated onto a single frequency band. In some implementations, the diversity signal may be a multi-band signal (also referred to as an inter-band carrier aggregation signal) including data modulated onto multiple frequency bands.

The DRx module 310 has an input that receives the diversity signal from the diversity antenna 140 and an output that provides a processed diversity signal to the transceiver 330 (via the transmission line 135 and the diversity RF module 320). The DRx module 310 input feeds into an input of first multiplexer (MUX) 311. The first multiplexer 311 includes a plurality of multiplexer outputs, each corresponding to a path between the input and the output of the DRx module 310. Each of the paths may correspond to a respective frequency band. The DRx module 310 output is provided by the output of second multiplexer 312. The second multiplexer 312 includes a plurality of multiplexer inputs, each corresponding to one of the paths between the input and the output of the DRx module 310.

The frequency bands may be cellular frequency bands, such as UMTS (Universal Mobile Telecommunications System) frequency bands. For example, a first frequency band may be UMTS downlink or "Rx" Band 2, between 1930 megahertz (MHZ) and 1990 MHz, and a second frequency band may be UMTS downlink or "Rx" Band 5, between 869 MHz and 894 MHz. Other downlink frequency bands may be used, such as those described below in Table 1 or other non-UMTS frequency bands.

In some implementations, the DRx module 310 includes a DRx controller 302 that receives signals from the controller 120 (also referred to as a communications controller) and, based on the received signals, selectively activates one or more of the plurality of paths between the input and the output. In some implementations, the DRx module 310 does not include a DRx controller 302 and the controller 120 selectively activates the one or more of the plurality of paths directly.

As noted above, in some implementations, the diversity signal is a single-band signal. Thus, in some implementations, the first multiplexer 311 is a single-pole/multiple-throw (SPMT) switch that routes the diversity signal to one of the plurality of paths corresponding to the frequency band of the single-band signal based on a signal received from the DRx controller 302. The DRx controller 302 may generate the signal based on a band select signal received by the DRx controller 302 from the communications controller 120. Similarly, in some implementations, the second multiplexer 312 is a SPMT switch that routes the signal from the one of the plurality of paths corresponding to the frequency band of the single-band signal based on a signal received from the DRx controller 302.

As noted above, in some implementations, the diversity signal is a multi-band signal. Thus, in some implementations, the first multiplexer 311 is a signal splitter that routes the diversity signal to two or more of the plurality of paths corresponding to the two or more frequency bands of the multi-band signal based on a splitter control signal received from the DRx controller 302. The function of the signal splitter may be implemented as a SPMT switch, a diplexer filter, or some combination of these. Similarly, in some implementations, the second multiplexer 312 is a signal combiner that combines the signals from the two or more of the plurality of paths corresponding to the two or more frequency bands of the multi-band signal based on a combiner control signal received from the DRx controller 302. The function of the signal combiner may be implemented as a SPMT switch, a diplexer filter, or some combination of these. The DRx controller 302 may generate the splitter control signal and the combiner control signal based on a band select signal received by the DRx controller 302 from the communications controller 120.

Thus, in some implementations, the DRx controller 302 is configured to selectively activate one or more of the plurality of paths based on a band select signal received by the DRx controller 302 (e.g., from the communications controller 120). In some implementations, the DRx controller 302 is configured to selectively activate one or more of the plurality of paths by transmitting a splitter control signal to a signal splitter and a combiner control signal to a signal combiner.

The DRx module 310 includes a plurality of bandpass filters 313a-313d. Each one of the bandpass filters 313a-313d is disposed along a corresponding one of the plurality of paths and configured to filter a signal received at the bandpass filter to the respective frequency band of the one of the plurality of paths. In some implementations, the bandpass filters 313a-313d are further configured to filter a signal received at the bandpass filter to a downlink frequency sub-band of the respective frequency band of the one of the plurality of paths. The DRx module 310 includes a plurality of amplifiers 314a-314d. Each one of the amplifiers 314a-314d is disposed along a corresponding one of the plurality of paths and configured to amplify a signal received at the amplifier.

In some implementations, the amplifiers 314a-314d are narrowband amplifiers configured to amplify a signal within the respective frequency band of the path in which the amplifier is disposed. In some implementations, the amplifiers 314a-314d are controllable by the DRx controller 302. For example, in some implementations, each of the amplifiers 314a-314d includes an enable/disable input and is enabled (or disabled) based on an amplifier enable signal received and the enable/disable input. The amplifier enable signal may be transmitted by the DRx controller 302. Thus, in some implementations, the DRx controller 302 is configured to selectively activate one or more of the plurality of paths by transmitting an amplifier enable signal to one or more of the amplifiers 314a-314d respectively disposed along the one or more of the plurality of paths. In such implementations, rather than being controlled by the DRx controller 302, the first multiplexer 311 may be a signal splitter that routes the diversity signal to each of the plurality of paths and the second multiplexer 312 may be a signal combiner that combines the signals from each of the plurality of paths. However, in implementations in which the DRx controller 302 controls the first multiplexer 311 and second multiplexer 312, the DRX controller 302 may also enable (or disable) particular amplifiers 314a-314d, e.g., to save battery.

In some implementations, the amplifiers 314a-314d are variable-gain amplifiers (VGAs). Thus, the some implementations, the DRx module 310 includes a plurality of variable-gain amplifiers (VGAs), each one of the VGAs disposed along a corresponding one of the plurality of paths and configured to amplify a signal received at the VGA with a gain controlled by an amplifier control signal received from the DRx controller 302.

The gain of a VGA may be bypassable, step-variable, continuously-variable. In some implementations, at least one of the VGAs includes a fixed-gain amplifier and a bypass switch controllable by the amplifier control signal. The bypass switch may (in a first position) close a line between an input of the fixed-gain amplifier to an output of fixed-gain amplifier, allowing a signal to bypass the fixed-gain amplifier. The bypass switch may (in a second position) open the line between the input and the output, passing a signal through the fixed-gain amplifier. In some implementations, when the bypass switch is in the first position, the fixed-gain amplifier is disabled or otherwise reconfigured to accommodate the bypass mode.

In some implementations, at least one of the VGAs includes a step-variable gain amplifier configured to amplify the signal received at the VGA with a gain of one of plurality of configured amounts indicated by the amplifier control signal. In some implementations, at least one of the VGAs includes a continuously-variable gain amplifier configured to amplify a signal received at the VGA with a gain proportional to the amplifier control signal.

In some implementations, the amplifiers 314a-314d are variable-current amplifiers (VCAs). The current drawn by a VCA may be bypassable, step-variable, continuously-variable. In some implementations, at least one of the VCAs includes a fixed-current amplifier and a bypass switch controllable by the amplifier control signal. The bypass switch may (in a first position) close a line between an input of the fixed-current amplifier to an output of fixed-current amplifier, allowing a signal to bypass the fixed-current amplifier. The bypass switch may (in a second position) open the line between the input and the output, passing a signal through the fixed-current amplifier. In some implementations, when the bypass switch is in the first position, the fixed-current amplifier is disabled or otherwise reconfigured to accommodate the bypass mode.

In some implementations, at least one of the VCAs includes a step-variable current amplifier configured to amplify the signal received at the VCA by drawing a current of one of plurality of configured amounts indicated by the amplifier control signal. In some implementations, at least one of the VCAs includes a continuously-variable current amplifier configured to amplify a signal received at the VCA by drawing a current proportional to the amplifier control signal.

In some implementations, the amplifiers 314a-314d are fixed-gain, fixed-current amplifiers. In some implementations, the amplifiers 314a-314d are fixed-gain, variable-current amplifiers. In some implementations, the amplifiers 314a-314d are variable-gain, fixed-current amplifiers. In some implementations, the amplifiers 314a-314d are variable-gain, variable-current amplifiers.

In some implementations, the DRx controller 302 generates the amplifier control signal(s) based on a quality of service metric of an input signal received at the input. In some implementations, the DRx controller 302 generates the amplifier control signal(s) based on a signal received from the communications controller 120, which may, in turn, be based on a quality of service (QoS) metric of the received signal. The QoS metric of the received signal may be based, at least in part, on the diversity signal received on the diversity antenna 140 (e.g., an input signal received at the input). The QoS metric of the received signal may be further based on a signal received on a primary antenna. In some implementations, the DRx controller 302 generates the amplifier control signal(s) based on a QoS metric of the diversity signal without receiving a signal from the communications controller 120.

In some implementations, the QoS metric includes a signal strength. As another example, the QoS metric may include a bit error rate, a data throughput, a transmission delay, or any other QoS metric.

As noted above, the DRx module 310 has an input that receives the diversity signal from the diversity antenna 140 and an output that provides a processed diversity signal to the transceiver 330 (via the transmission line 135 and the diversity RF module 320). The diversity RF module 320 receives the processed diversity signal via the transmission line 135 and performs further processing. In particular, the processed diversity signal is split or routed by a diversity RF multiplexer 321 to one or more paths on which the split or routed signal is filtered by corresponding bandpass filters 323a-323d and amplified by corresponding amplifiers 324a-324d. The output of each of the amplifiers 324a-324d is provided to the transceiver 330.

The diversity RF multiplexer 321 may be controlled by the controller 120 (either directly or via or an on-chip diversity RF controller) to selectively activate one or more of the paths. Similarly, the amplifiers 324a-324d may be controlled by the controller 120. For example, in some implementations, each of the amplifiers 324a-324d includes an enable/disable input and is enabled (or disabled) based on an amplifier enable signal. In some implementations, the amplifiers 324a-324d are variable-gain amplifiers (VGAs) that amplify a signal received at the VGA with a gain controlled by an amplifier control signal received from the controller 120 (or an on-chip diversity RF controller controlled by the controller 120). In some implementations, the amplifiers 324a-324d are variable-current amplifiers (VCAs).

With the DRx module 310 added to the receiver chain already including the diversity RF module 320, the number of bandpass filters in the DRx configuration 300 is doubled. Thus, in some implementations, bandpass filters 323a-323d are not included in the diversity RF module 320. Rather, the bandpass filters 313a-313d of the DRx module 310 are used to reduce the strength of out-of-band blockers. Further, the automatic gain control (AGC) table of the diversity RF module 320 may be shifted to reduce the amount of gain provided by the amplifiers 324a-324d of the diversity RF module 320 by the amount of the gain provided by the amplifiers 314a-314d of the DRx module 310.

For example, if the DRx module gain is 15 dB and the receiver sensitivity is −100 dBm, the diversity RF module 320 will see −85 dBm of sensitivity. If the closed-loop AGC of the diversity RF module 320 is active, its gain will drop by 15 dB automatically. However, both signal components and out-of-band blockers are received amplified by 15 dB. Thus, the 15 dB gain drop of the diversity RF module 320 may also be accompanied by a 15 dB increase in its linearity. In particular, the amplifiers 324a-324d of the diversity RF module 320 may be designed such that the linearity of the amplifiers increases with reduced gain (or increased current).

In some implementations, the controller 120 controls the gain (and/or current) of the amplifiers 314a-314d of the DRx module 310 and the amplifiers 324a-324d of the diversity RF module 320. As in the example above, the controller 120 may reduce an amount of gain provided by the amplifiers 324a-324d of the diversity RF module 320 in response to increasing an amount of gain provided by the amplifiers 314a-314d of the DRx module 310. Thus, in some implementations, the controller 120 is configured to generate a downstream amplifier control signal (for the amplifiers 324a-324d of the diversity RF module 320) based on the amplifier control signal (for the amplifiers 314a-314d of the DRx module 310) to control a gain of one or more downstream amplifiers 324a-324d coupled to the output (of the DRx module 310) via the transmission line 135. In some implementations, the controller 120 also controls the gain of other components of the wireless device, such as amplifiers in the front-end module (FEM), based on the amplifier control signal.

As noted above, in some implementations, the bandpass filters 323a-323d are not included. Thus, in some implementations, at least one of the downstream amplifiers 324a-324d are coupled to the output (of the DRx module 310) via the transmission line 135 without passing through a downstream bandpass filter.

Figure 4:
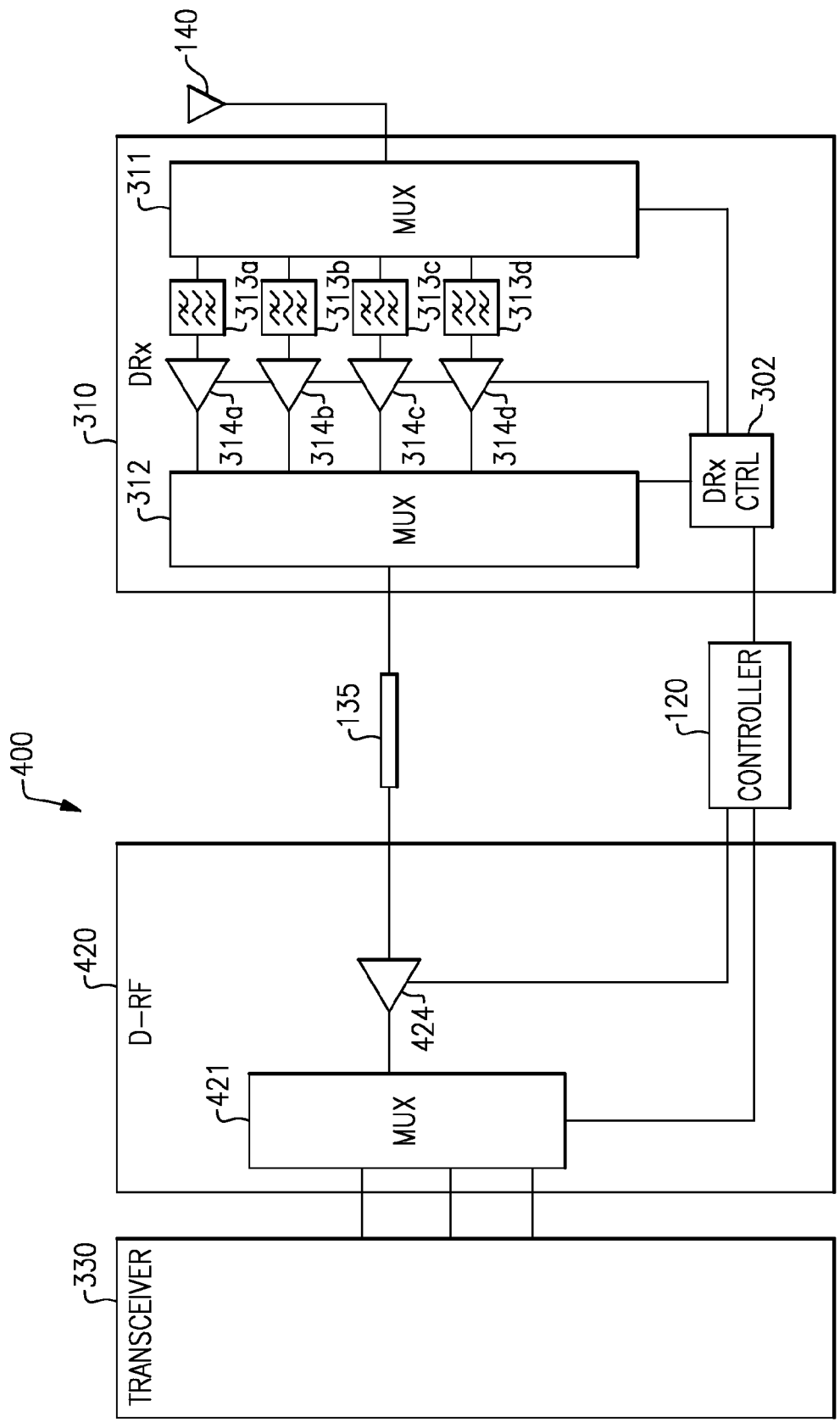
FIG. 4 shows that in some embodiments, a diversity receiver configuration may include a diversity RF module with fewer amplifiers than a diversity receiver (DRx) module.

FIG. 4 shows that in some embodiments, a diversity receiver configuration 400 may include a diversity RF module 420 with fewer amplifiers than a diversity receiver (DRx) module 310. The diversity receiver configuration 400 includes a diversity antenna 140 and a DRx module 310 as described above with respect to FIG. 3. The output of the DRx module 310 is passed, via a transmission line 135, to a diversity RF module 420 which differs from the diversity RF module 320 of FIG. 3 in that the diversity RF module 420 of FIG. 4 includes fewer amplifiers than the DRx module 310.

As mentioned above, in some implementations, the diversity RF module 420 does not include bandpass filters. Thus, in some implementations, the one or more amplifiers 424 of the diversity RF module 420 need not be band-specific. In particular, the diversity RF module 420 may include one or more paths, each including an amplifier 424, that are not mapped 1-to-1 with the paths DRx module 310. Such a mapping of paths (or corresponding amplifiers) may be stored in the controller 120.

Accordingly, whereas the DRx module 310 includes a number of paths, each corresponding to a frequency band, the diversity RF module 420 may include one or more paths that do not correspond to a single frequency band.

In some implementations (as shown in FIG. 4), the diversity RF module 420 includes a single wide-band or tunable amplifier 424 that amplifies the signal received from the transmission line 135 and outputs an amplified signal to a multiplexer 421. The multiplexer 421 includes a plurality of multiplexer outputs, each corresponding to a respective frequency band. In some implementations, the diversity RF module 420 does not include any amplifiers.

In some implementations, the diversity signal is a single-band signal. Thus, in some implementations, the multiplexer 421 is a SPMT switch that routes the diversity signal to one of the plurality of outputs corresponding to the frequency band of the single-band signal based on a signal received from the controller 120. In some implementations, the diversity signal is a multi-band signal. Thus, in some implementations, the multiplexer 421 is a signal splitter that routes the diversity signal to two or more of the plurality of outputs corresponding to the two or more frequency bands of the multi-band signal based on a splitter control signal received from the controller 120. In some implementations, diversity RF module 420 may be combined with the transceiver 330 as a single module.

In some implementations, the diversity RF module 420 includes multiple amplifiers, each corresponding to a set of frequency bands. The signal from the transmission line 135 may be fed into a band splitter that outputs high frequencies along a first path to a high-frequency amplifier and outputs low frequencies along a second path to a low-frequency amplifier. The output of each of the amplifiers may be provided to the multiplexer 421 which is configured to route the signal to the corresponding inputs of the transceiver 330.

Figure 5:
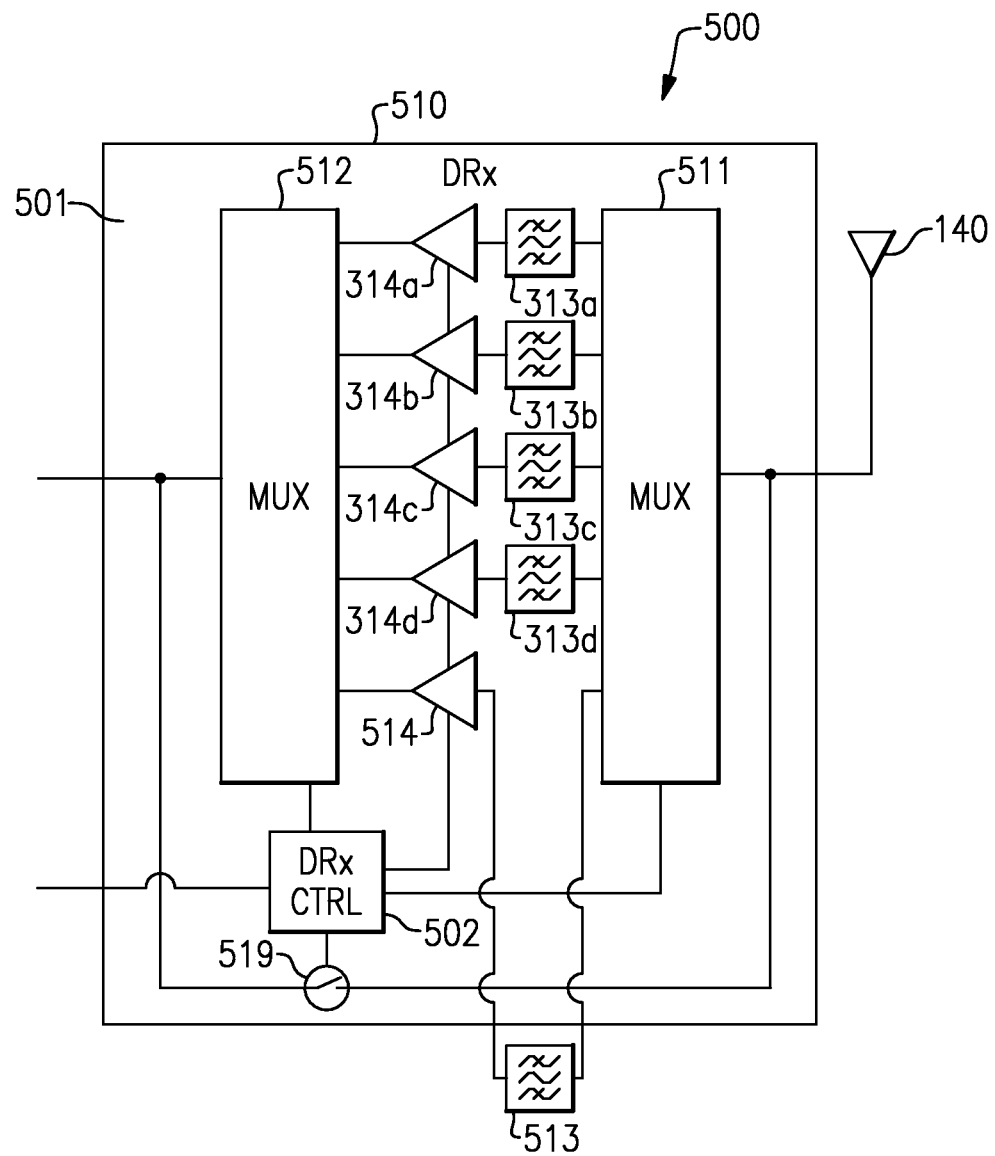
FIG. 5 shows that in some embodiments, a diversity receiver configuration may include a DRx module coupled to an off-module filter.

FIG. 5 shows that in some embodiments, a diversity receiver configuration 500 may include a DRx module 510 coupled to an off-module filter 513. The DRx module 510 may include a packaging substrate 501 configured to receive a plurality of components and a receiving system implemented on the packaging substrate 501. The DRx module 510 may include one or more signal paths that are routed off the DRx module 510 and made available to a system integrator, designer, or manufacturer to support a filter for any desired band.

The DRx module 510 includes a number of paths between the input and the output of the DRx module 510. The DRx module 510 includes a bypass path between the input and the output activated by a bypass switch 519 controlled by the DRx controller 502. Although FIG. 5 illustrates a single bypass switch 519, in some implementations, the bypass switch 519 may include multiple switches (e.g., a first switch disposed physically close to the input and a second switch disposed physically close to the output. As shown in FIG. 5, the bypass path does not include a filter or an amplifier.

The DRx module 510 includes a number of multiplexer paths including a first multiplexer 511 and a second multiplexer 512. The multiplexer paths include a number of on-module paths that include the first multiplexer 511, a bandpass filter 313a-313d implemented on the packaging substrate 501, an amplifier 314a-314d implemented on the packaging substrate 501, and the second multiplexer 512. The multiplexer paths include one or more off-module paths that include the first multiplexer 511, a bandpass filter 513 implemented off the packaging substrate 501, an amplifier 514, and the second multiplexer 512. The amplifier 514 may be a wide-band amplifier implemented on the packaging substrate 501 or may also be implemented off the packaging substrate 501. As described above, the amplifiers 314a-314d, 514 may be variable-gain amplifiers and/or variable-current amplifiers.

The DRx controller 502 is configured to selectively activate one or more of the plurality of paths between the input and the output. In some implementations, the DRx controller 502 is configured to selectively activate one or more of the plurality of paths based on a band select signal received by the DRx controller 502 (e.g., from a communications controller). The DRx controller 502 may selectively activate the paths by, for example, opening or closing the bypass switch 519, enabling or disabling the amplifiers 314a-314d, 514, controlling the multiplexers 511, 512, or through other mechanisms. For example, the DRx controller 502 may open or close switches along the paths (e.g., between the filters 313a-313d, 513 and the amplifiers 314a-314d, 514) or by setting the gain of the amplifiers 314a-314d, 514 to substantially zero.

Figure 6A:
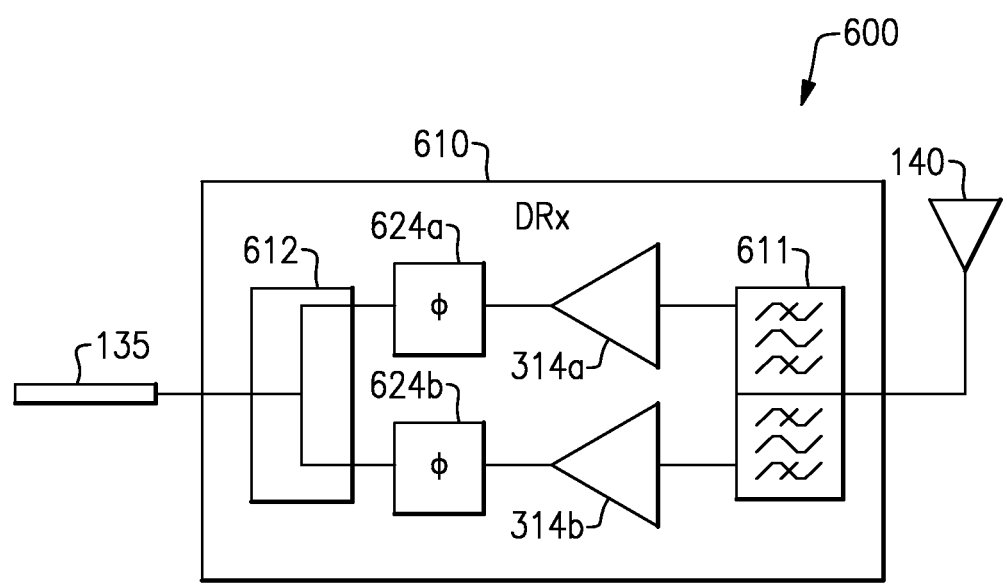
FIG. 6A shows that in some embodiments, a diversity receiver configuration may include a DRx module with one or more phase matching components.

FIG. 6A shows that in some embodiments, a diversity receiver configuration 600 may include a DRx module 610 with one or more phase matching components 624a-624b. The DRx module 610 includes two paths from an input of the DRx module 610, coupled to an antenna 140, and an output of the DRx module 610, coupled to a transmission line 135.

In the DRx module 610 of FIG. 6A, the signal splitter and bandpass filters are implemented as a diplexer 611. The diplexer 611 includes an input coupled to the antenna 140, a first output coupled to a first amplifier 314a, and a second output coupled to a second amplifier 314b. At the first output, the diplexer 611 outputs a signal received at the input (e.g., from the antenna 140) filtered to a first frequency band. At the second output, the diplexer 611 outputs the signal received at the input filtered to a second frequency band. In some implementations, the diplexer 611 may be replaced with a triplexer, a quadplexer, or any other multiplexer configured to split an input signal received at the input of the DRx module 610 into a plurality of signals at a respective plurality of frequency bands propagated along a plurality of paths.

As described above, each one of the amplifiers 314a-314b is disposed along a corresponding one of the paths and is configured to amplify a signal received at the amplifier. The output of the amplifiers 314a-314b are fed through a corresponding phase-shift component 624a-624b before being combined by a signal combiner 612.

The signal combiner 612 includes a first input coupled to the first phase shift component 624a, a second input coupled to second phase shift component 624b, and an output coupled to the output of the DRx module 610. The signal at the output of the signal combiner is a sum of the signals at the first input and the second input. Thus, the signal combiner is configured to combine signals propagated along the plurality of paths.

When a signal is received by the antenna 140, the signal is filtered by the diplexer 611 to a first frequency band and propagated along the first path through the first amplifier 314a. The filtered and amplified signal is phase-shifted by the first phase-shift component 624a and fed to the first input of the signal combiner 612. In some implementations, the signal combiner 612 or the second amplifier 314b do not prevent the signal from continuing through the signal combiner 612 along the second path in a reverse direction. Thus, the signal propagates through the second phase-shift component 624b and through the second amplifier 314b, where it reflects off the diplexer 611. The reflected signal propagates through the second amplifier 314b and the second phase-shift component 624b to reach the second input of the signal combiner 612.

When the initial signal (at the first input of the signal combiner 612) and the reflected signal (at the second input of the signal combiner 612) are out-of-phase, the summation performed by the signal combiner 612 results in a weakening of the signal at the output of the signal combiner 612. Similarly, when the initial signal and the reflected signal are in-phase, the summation performed by the signal combiner 612 results in a strengthening of the signal at the output of the signal combiner 612. Thus, in some implementations, the second phase-shift component 624b is configured to phase-shift the signal (at least in the first frequency band) such that the initial signal and the reflected signal are at least partially in-phase. In particular, the second phase-shift component 624b is configured to phase-shift the signal (at least in the first frequency band) such that the amplitude of the sum of initial signal and the reflected signal is greater than the amplitude of the initial signal.

For example, the second phase-shift component 624b may be configured to phase-shift a signal passing through the second phase-shift component 624b by $-\frac{1}{2}$ times the phase-shift introduced by reverse propagation through the second amplifier 314b, reflection off the diplexer 611, and forward propagation through the second amplifier 314b. As another example, the second phase-shift component 624b may be configured to phase-shift a signal passing through the second phase-shift component 624b by half of the difference between 360 degrees and the phase-shift introduced by reverse propagation through the second amplifier 314b, reflection off the diplexer 611, and forward propagation through the second amplifier 314b. In general, the second phase-shift component 624b may be configured to phase-shift a signal passing through the second phase-shift component 624b such that the initial signal and the reflected signal have a phase difference of an integer multiple (including zero) of 360 degrees.

As an example, the initial signal may be at 0 degrees (or any other reference phase), and the reverse propagation through the second amplifier 314b, reflection off the diplexer 611, and forward propagation through the second amplifier 314b may introduce a phase shift of 140 degrees. Thus, in some implementations, the second phase-shift component 624b is configured to phase-shift a signal passing through the second phase-shift component 624b by −70 degrees. Thus, the initial signal is phase-shifted to −70 degrees by the second phase-shift component 624b, to 70 degrees by reverse propagation through the second amplifier 314b, reflection off the diplexer 611, and forward propagation through the second amplifier 314b, and back to 0 degrees by the second-phase shift component 624b.

In some implementations, the second phase-shift component 624b is configured to phase-shift a signal passing through the second phase-shift component 624b by 110 degrees. Thus, the initial signal is phase-shifted to 110 degrees by the second phase-shift component 624b, to 250 degrees by reverse propagation through the second amplifier 314b, reflection off the diplexer 611, and forward propagation through the second amplifier 314b, and to 360 degrees by the second-phase shift component 624b.

At the same time, the signal received by the antenna 140 is filtered by the diplexer 611 to a second frequency band and propagated along the second path through the second amplifier 314b. The filtered and amplified signal is phase-shifted by the second phase-shift component 624b and fed to the second input of the signal combiner 612. In some implementations, the signal combiner 612 or the first amplifier 314a do not prevent the signal from continuing through the signal combiner 612 along the first path in a reverse direction. Thus, the signal propagates through the first phase-shift component 624a and through the second amplifier 314a, where it reflects off the diplexer 611. The reflected signal propagates through the first amplifier 314a and the first phase-shift component 624a to reach the first input of the signal combiner 612.

When the initial signal (at the second input of the signal combiner 612) and the reflected signal (at the first input of the signal combiner 612) are out-of-phase, the summation performed by the signal combiner 612 results in a weakening of the signal at the output of the signal combiner 612 and when the initial signal and the reflected signal are in-phase, the summation performed by the signal combiner 612 results in a strengthening of the signal at the output of the signal combiner 612. Thus, in some implementations, the first phase-shift component 624a is configured to phase-shift the signal (at least in the second frequency band) such that the initial signal and the reflected signal are at least partially in-phase.

For example, the first phase-shift component 624a may be configured to phase-shift a signal passing through the first phase-shift component 624a by −½ times the phase-shift introduced by reverse propagation through the first amplifier 314a, reflection off the diplexer 611, and forward propagation through the first amplifier 314a. As another example, the first phase-shift component 624a may be configured to phase-shift a signal passing through the first phase-shift component 624a by half of the difference between 360 degrees and the phase-shift introduced by reverse propagation through the first amplifier 314a, reflection off the diplexer 611, and forward propagation through the first amplifier 314a. In general, the first phase-shift component 624a may be configured to phase-shift a signal passing through the first phase-shift component 624a such that the initial signal and the reflected signal have a phase difference of an integer multiple (including zero) of 360 degrees.

The phase-shift components 624a-624b may be implemented as passive circuits. In particular, the phase-shift components 624a-624b may be implemented as LC circuits and include one or more passive components, such as inductors and/or capacitors. The passive components may be connected in parallel and/or in series and may be connected between the outputs of the amplifiers 314a-314b and the inputs of the signal combiner 612 or may be connected between the outputs of the amplifiers 314a-314b and a ground voltage. In some implementations, the phase-shift components 624a-624b are integrated into the same die as the amplifiers 314a-314b or on the same package.

In some implementations (e.g., as shown in FIG. 6A), the phase-shift components 624a-624b are disposed along the paths after the amplifiers 314a-314b. Thus, any signal attenuation caused by the phase-shift components 624a-624b does not affect the performance of the module 610, e.g., the signal-to-noise ratio of the output signal. However, in some implementations, the phase-shift components 624a-624b are disposed along the paths before the amplifiers 314a-314b. For example, the phase-shift components 624a-624b may be integrated into an impedance matching component disposed between the diplexer 611 and the amplifiers 314a-314b.

Figure 6B:
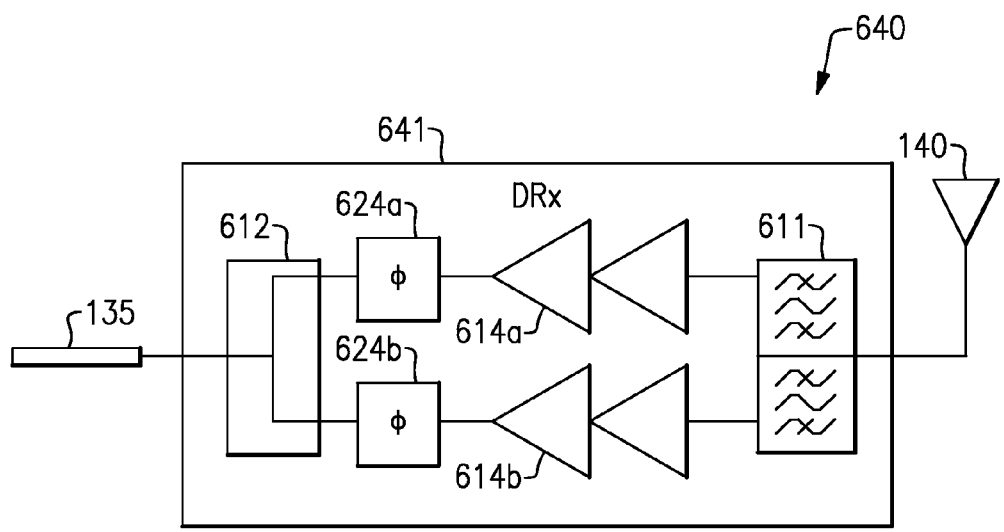
FIG. 6B shows that in some embodiments, a diversity receiver configuration may include a DRx module with one or more phase matching components and dual-stage amplifiers.

FIG. 6B shows that in some embodiments, a diversity receiver configuration 640 may include a DRx module 641 with one or more phase matching components 624a-624b and dual-stage amplifiers 614a-614b. The DRx module 641 of FIG. 6B is substantially similar to the DRx module 610 of FIG. 6A, except that the amplifiers 314a-314b of the DRx module 610 of FIG. 6A are replaced with dual-stage amplifiers 614a-614b in the DRx module 641 of FIG. 6B.

Figure 6C:
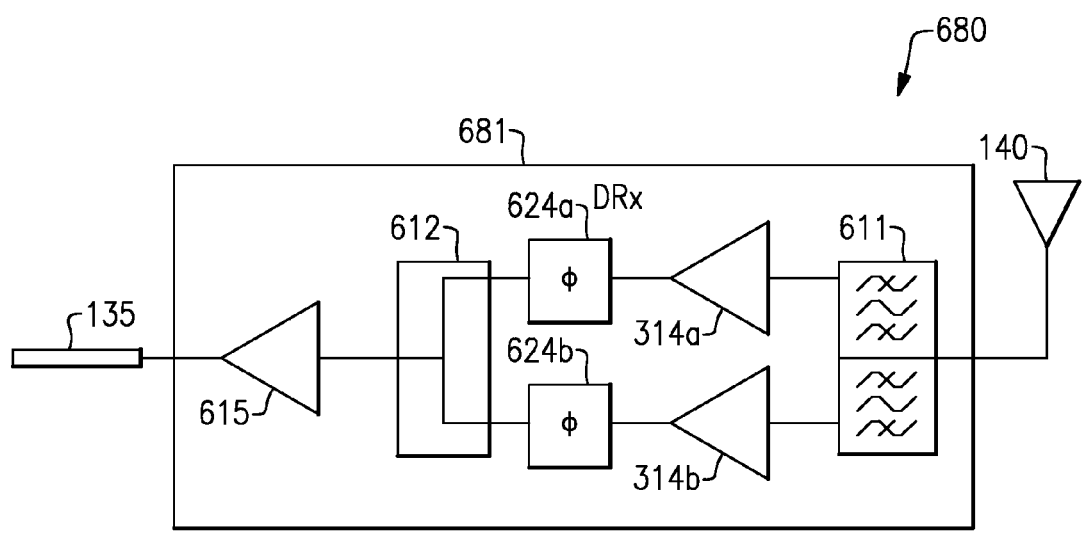
FIG. 6C shows that in some embodiments, a diversity receiver configuration may include a DRx module with one or more phase matching components and a post-combiner amplifier.

FIG. 6C shows that in some embodiments, a diversity receiver configuration 680 may include a DRx module 681 with one or more phase matching components 624a-624b and a post-combiner amplifier 615. The DRx module 681 of FIG. 6C is substantially similar to the DRx module 610 of FIG. 6A, except that the DRx module 681 of FIG. 6C includes a post-combiner amplifier 615 disposed between the output of the signal combiner 612 and the output of the DRx module 681. Like the amplifiers 314a-314b, the post-combiner amplifier 615 may be a variable-gain amplifier (VGA) and/or a variable-current amplifier controlled by a DRx controller (not shown).

Figure 7:
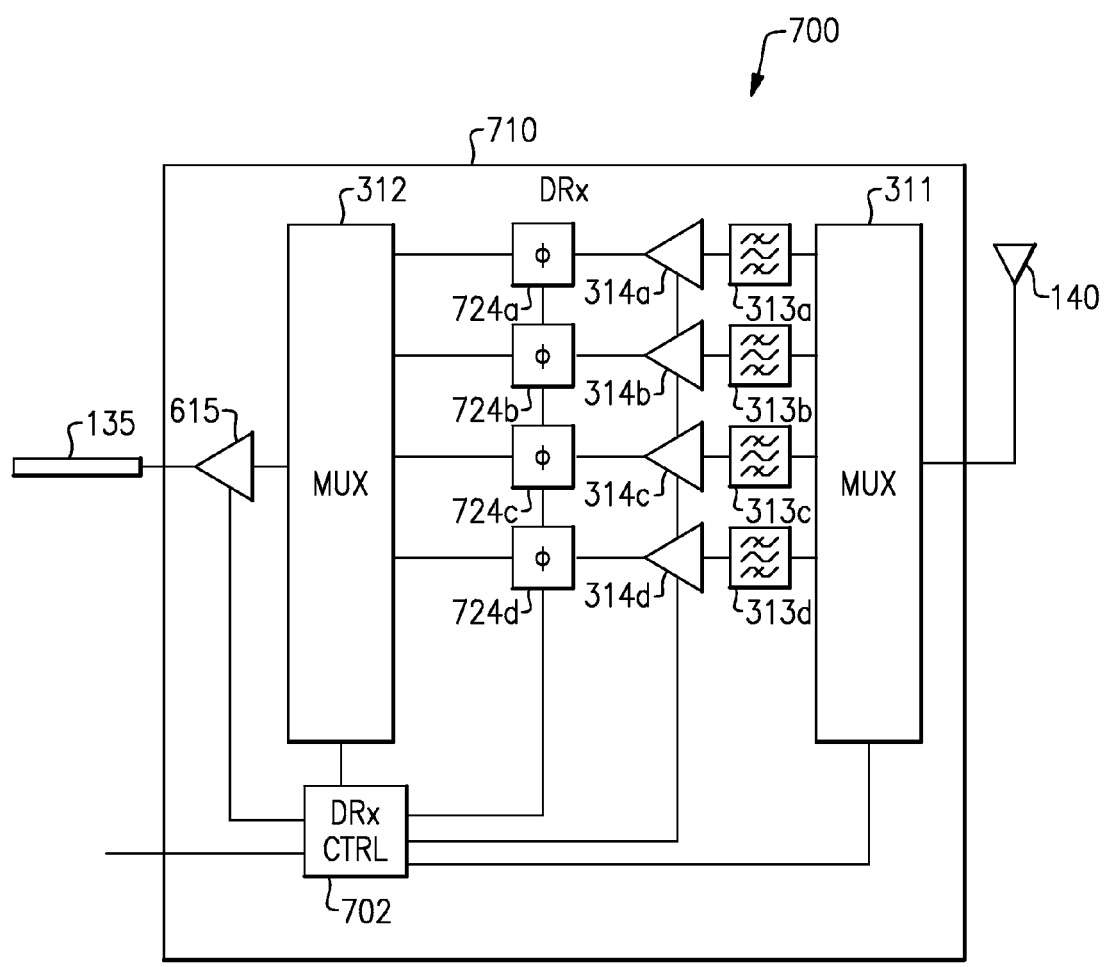
FIG. 7 shows that in some embodiments, a diversity receiver configuration may include a DRx module with tunable phase-shift components.

FIG. 7 shows that in some embodiments, a diversity receiver configuration 700 may include a DRx module 710 with tunable phase-shift components 724a-724d. Each of the tunable phase-shift components 724a-724d may be configured to phase-shift a signal passing through the tunable phase-shift component an amount controlled by a phase-shift tuning signal received from a DRx controller 702.

The diversity receiver configuration 700 includes a DRx module 710 having an input coupled to an antenna 140 and an output coupled to a transmission line 135. The DRx module 710 includes a number of paths between the input and the output of the DRx module 710. In some implementations, the DRx module 710 includes one or more bypass paths (not shown) between the inputs and the output activated by one or more bypass switches controlled by the DRx controller 702.

The DRx module 710 includes a number of multiplexer paths including an input multiplexer 311 and an output multiplexer 312. The multiplexer paths include a number of on-module paths (shown) that include the input multiplexer 311, a bandpass filter 313a-313d, an amplifier 314a-314d, a tunable phase-shift component 724a-724d, the output multiplexer 312, and a post-combiner amplifier 615. The multiplexer paths may include one or more off-module paths (not shown) as described above. As also described above, the amplifiers 314a-314d (including the post-gain amplifier 615) may be variable-gain amplifiers and/or variable-current amplifiers.

The tunable phase-shift components 724a-724d may include one or more variable components, such as inductors and capacitors. The variable components may be connected in parallel and/or in series and may be connected between the outputs of the amplifiers 314a-314d and the inputs of the output multiplexer 312 or may be connected between the outputs of the amplifiers 314a-314d and a ground voltage.

The DRx controller 702 is configured to selectively activate one or more of the plurality of paths between the input and the output. In some implementations, the DRx controller 702 is configured to selectively activate one or more of the plurality of paths based on a band select signal received by the DRx controller 702 (e.g., from a communications controller). The DRx controller 702 may selectively activate the paths by, for example, enabling or disabling the amplifiers 314a-314d, controlling the multiplexers 311, 312, or through other mechanisms as described above.

In some implementations, the DRx controller 702 is configured to tune the tunable phase-shift components 724a-724d. In some implementations, the DRx controller 702 tunes the tunable phase-shift components 724a-724d based on the band select signal. For example, the DRx controller 702 may tune the tunable phase-shift components 724a-724d based on a lookup table that associates frequency bands (or sets of frequency bands) indicated by the band select signal with tuning parameters. Accordingly, in response to a band select signal, the DRx controller 702 may transmit a phase-shift tuning signal to the tunable phase-shift component 724a-724d of each active path to tune the tunable phase-shift component (or the variable components thereof) according to the tuning parameters.

The DRx controller 702 may be configured to tune the tunable phase-shift components 724a-724d such that out-of-band reflected signals are in-phase at the output multiplexer 312 with out-of-band initial signals. For example, if the band select signal indicates that the first path (through the first amplifier 314a) corresponding to a first frequency band, the second path (through the second amplifier 314b) corresponding to a second frequency band, and the third path (through the third amplifier 314c) are to be activated, the DRx controller 702 may tune the first tunable phase-shift component 724a such that (1) for a signal propagating along the second path (at the second frequency band), the initial signal is in-phase with a reflected signal that reverse propagates along the first path, reflects off the bandpass filter 313a, and forward propagates through the first path and (2) for a signal propagating along the third path (at the third frequency band), the initial signal is in-phase with a reflected signal that reverse propagates along the first path, reflects off the bandpass filter 313a, and forward propagates through the first path.

The DRx controller 702 may tune the first tunable phase-shift component 724a such that the second frequency band is phase-shifted a different amount than the third frequency band. For example, if the signal at the second frequency band is phase-shifted by 140 degrees and the third frequency band is phase-shifted by 130 degrees by reverse propagation through the first amplifier 314a, reflection off the bandpass filter 313a, and forward propagation through the first amplifier 314b, the DRx controller 702 may tune the first tunable phase-shift component 724a to phase-shift the second frequency band by −70 degrees (or 110 degrees) and phase-shift the third frequency band by −65 degrees (or 115 degrees).

The DRx controller 702 may similarly tune the second phase-shift component 724b and third phase-shift component 724c.

As another example, if the band select signal indicates that the first path, the second path, and the fourth path (through the fourth amplifier 314d) are to be activated, the DRx controller 702 may tune the first tunable phase-shift component 724a such that (1) for a signal propagating along the second path (at the second frequency band), the initial signal is in-phase with a reflected signal that reverse propagates along the first path, reflects off the bandpass filter 313a, and forward propagates through the first path and (2) for a signal propagating along the fourth path (at the fourth frequency band), the initial signal is in-phase with a reflected signal that reverse propagates along the first path, reflects off the bandpass filter 313a, and forward propagates through the first path.

The DRx controller 702 may tune the variable components of the tunable phase-shift components 724a-724d to have different values for different sets of frequency bands.

In some implementations, the tunable phase-shift components 724a-724d are replaced with fixed phase-shift components that are not tunable or controlled by the DRx controller 702. Each one of the phase-shift components disposed along a corresponding one of the paths corresponding to one frequency band may be configured to phase-shift each of the other frequency bands such that an initial signal along a corresponding other path is in-phase with a reflected signal that reverse propagates along the one of the paths, reflects off the corresponding bandpass filter, and forward propagates through the one of the paths.

For example, the third phase-shift component 724c may be fixed and configured to (1) phase-shift the first frequency band such that an initial signal at the first frequency (propagating along the first path) is in-phase with a reflected signal that reverse propagates along the third path, reflects off the third bandpass filter 313c, and forward propagates through the third path, (2) phase-shift the second frequency band such that an initial signal at the second frequency (propagating along the second path) is in-phase with a reflected signal that reverse propagates along the third path, reflects off the third bandpass filter 313c, and forward propagates through the third path, and (3) phase-shift the fourth frequency band such that an initial signal at the fourth frequency (propagating along the fourth path) is in-phase with a reflected signal that reverse propagates along the third path, reflects off the third bandpass filter 313c, and forward propagates through the third path. The other phase-shift components may be similarly fixed and configured.

Thus, the DRx module 710 includes a DRx controller 702 configured to selectively one or more of a plurality of paths between an input of the DRx module 710 and an output of the DRx module 710. The DRx module 710 further includes plurality of amplifiers 314a-314d, each one of the plurality of amplifiers 314a-314d disposed along a corresponding one of the plurality of paths and configured to amplify a signal received at the amplifier. The DRx module further includes a plurality of phase-shift components 724a-724d, each one of the plurality of phase-shift components 724a-724d disposed along a corresponding one of the plurality of paths and configured to phase-shift a signal passing through the phase-shift component.

In some implementations, the first phase-shift component 724a is disposed along a first path corresponding to a first frequency band (e.g., the frequency band of the first bandpass filter 313a) and is configured to phase-shift a second frequency band (e.g., the frequency band of the second bandpass filter 313b) of a signal passing through the first phase-shift component 724a such that an initial signal propagated along a second path corresponding to the second frequency band and a reflected signal propagated along the first path are at least partially in-phase.

In some implementations, the first phase-shift component 724a is further configured to phase-shift a third frequency band (e.g., the frequency band of the third bandpass filter 313c) of a signal passing through the first phase-shift component 724a such that an initial signal propagated along a third path corresponding to the third frequency band and a reflected signal propagated along the first path are at least partially in-phase.

Similarly, in some implementations, the second phase-shift component 724b disposed along the second path is configured to phase-shift the first frequency band of a signal passing through the second phase-shift component 724b such that an initial signal propagated along the first path and a reflected signal propagated along the second path are at least partially in-phase.

Figure 8:
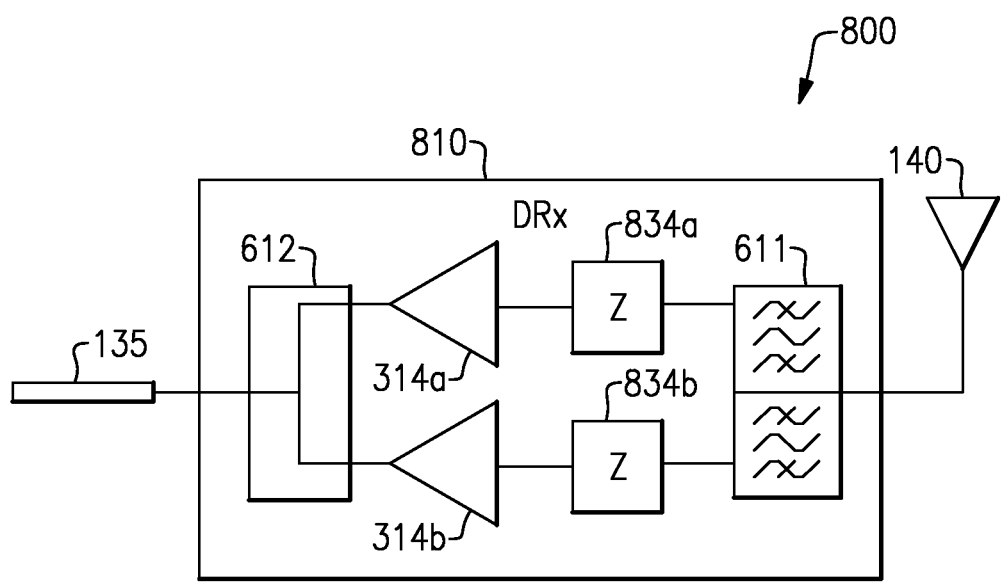
FIG. 8 shows that in some embodiments, a diversity receiver configuration may include a DRx module with one or more impedance matching components.

FIG. 8 shows that in some embodiments, a diversity receiver configuration 800 may include a DRx module 810 with one or more impedance matching components 834a-834b. The DRx module 810 includes two paths from an input of the DRx module 810, coupled to an antenna 140, and an output of the DRx module 810, coupled to a transmission line 135.

In the DRx module 810 of FIG. 8 (as in the DRx module 610 of FIG. 6A), the signal splitter and bandpass filters are implemented as a diplexer 611. The diplexer 611 includes an input coupled to the antenna, a first output coupled to a first impedance matching component 834a, and a second output coupled to a second impedance matching component 834b. At the first output, the diplexer 611 outputs a signal received at the input (e.g., from the antenna 140) filtered to a first frequency band. At the second output, the diplexer 611 outputs the signal received at the input filtered to a second frequency band.

Each of the impedance matching components 834a-634d is disposed between the diplexer 611 and an amplifier 314a-314b. As described above, each one of the amplifiers 314a-314b is disposed along a corresponding one of the paths and is configured to amplify a signal received at the amplifier. The output of the amplifiers 314a-314b are fed to a signal combiner 612.

The signal combiner 612 includes a first input coupled to the first amplifier 314a, a second input coupled to second amplifier 314b, and an output coupled to the output of the DRx module 610. The signal at the output of the signal combiner is a sum of the signals at the first input and the second input.

When a signal is received by the antenna 140, the signal is filtered by the diplexer 611 to a first frequency band and propagated along the first path through the first amplifier 314a. Similarly, the signal is filtered by the diplexer 611 to a second frequency band and propagated along the second path through the second amplifier 314b.

Each of the paths may be characterized by a noise figure and a gain. The noise figure of each path is a representation of the degradation of the signal-to-noise ratio (SNR) caused by the amplifier and impedance matching component disposed along the path. In particular, the noise figure of each path is the difference in decibels (dB) between the SNR at the input of the impedance matching component 834a-834b and the SNR at the output of the amplifier 314a-314b. Thus, the noise figure is a measure of the difference between the noise output of the amplifier to the noise output of an "ideal" amplifier (that does not produce noise) with the same gain. Similarly, the gain for each path is a representation of the gain caused by the amplifier and the impedance matching component disposed along the path.

The noise figure and gain of each path may be different for different frequency bands. For example, the first path may have an in-band noise figure and in-band gain for the first frequency band and an out-of-band noise figure and out-of-band gain for the second frequency band. Similarly, the second path may have an in-band noise figure and in-band gain for the second frequency band and an out-of-band noise figure and out-of-band gain for the first frequency band.

The DRx module 810 may also be characterized by a noise figure and a gain which may be different for different frequency bands. In particular, the noise figure of the DRx module 810 is the difference in dB between the SNR at the input of the DRx module 810 and the SNR at the output of the DRx module 810.

The noise figure and gain of each path (at each frequency band) may depend, at least in part, on the impedance (at each frequency band) of the impedance matching component 834a-834b. Accordingly, it may be advantageous that the impedance of the impedance matching component 834a-834b is such that the in-band noise figure of each path is minimized and/or the in-band gain of each path is maximized. Thus, in some implementations, each of the impedance matching components 834a-834b is configured to decrease the in-band noise figure of its respective path and/or increase the in-band gain of its respective path (as compared to a DRx module lacking such impedance matching components 834a-834b).

Because the signal propagating along the two paths are combined by the signal combiner 612, out-of-band noise produced or amplified by an amplifier can negatively affect the combined signal. For example, out-of-band noise produced or amplified by the first amplifier 314a may increase the noise figure of the DRx module 810 at the second frequency. Accordingly, it may be advantageous that the impedance of the impedance matching component 834a-834b is such that the out-of-band noise figure of each path is minimized and/or the out-of-band gain of each path is minimized. Thus, in some implementations, each of the impedance matching component 834a-834b is configured to decrease the out-of-band noise figure of its respective path and/or decrease the out-of-band gain of its respective path (as compared to a DRx module lacking such impedance matching components 834a-834b).

The impedance matching components 834a-834b may be implemented as passive circuits. In particular, the impedance matching components 834a-834b may be implemented as RLC circuits and include one or more passive components, such as resistors, inductors and/or capacitors. The passive components may be connected in parallel and/or in series and may be connected between the outputs of the diplexer 611 and the inputs of the amplifiers 314a-314b or may be connected between the outputs of the diplexer 611 and a ground voltage. In some implementations, the impedance matching components 834a-834b are integrated into the same die as the amplifiers 314a-314b or on the same package.

As noted above, for a particular path, it may be advantageous that the impedance of the impedance matching component 834a-834b is such that the in-band noise figure is minimized, the in-band gain is maximized, the out-of-band noise figure is minimized, and the out-of-band gain is minimized. Designing an impedance matching component 834a-834b to achieve all four of these goals with only two degrees of freedom (e.g., the impedance at the first frequency band and the impedance at the second frequency band) or other various constraints (e.g., component number, cost, die space) may be challenging. Accordingly, in some implementations, an in-band metric of the in-band noise figure minus the in-band gain is minimized and an out-of-band metric of the out-of-band noise figure plus the out-of-band gain is minimized. Designing an impedance matching component 834a-834b to achieve both of these goals with various constraints may still be challenging. Thus, in some implementations, the in-band metric is minimized subject to a set of constraints and the out-of-band metric is minimized subject to the set of constraints and the additional constraint that the in-band metric not be increased by more than a threshold amount (e.g., 0.1 dB, 0.2 dB, 0.5 dB or any other value). Accordingly, the impedance matching component is configured to reduce an in-band metric of the in-band noise figure minus the in-band gain to within a threshold amount of an in-band metric minimum, e.g., the minimum possible in-band metric subject to any constraints. The impedance matching component is further configured to reduce an out-of-band metric of the out-of-band noise figure plus the out-of-band gain to an in-band-constrained out-of-band minimum, e.g., the minimum possible out-of-band metric subject to the additional constraint that the in-band metric not be increased by more than a threshold amount. In some implementations, a composite metric of the in-band metric (weighted by an in-band factor) plus the out-of-band metric (weighted by an out-of-band factor) is minimized subject to any constraints.

Thus, in some implementations, each of the impedance matching components 834a-834b is configured to decrease the in-band metric (the in-band noise figure minus the in-band gain) of its respective path (e.g., by decreasing the in-band noise figure, increasing the in-band gain, or both). In some implementations, each of the impedance matching components 834a-834b is further configured to decrease the out-of-band metric (the out-of-band noise figure plus the out-of-band gain) of its respective path (e.g., by decreasing the out-of-band noise figure, decreasing the out-of-band gain, or both).

In some implementations, by decreasing the out-of-band metrics, the impedance matching components 834a-834b decreases the noise figure of the DRx module 810 at one or more of the frequency bands without substantially increasing the noise figure at other frequency bands.

Figure 9:
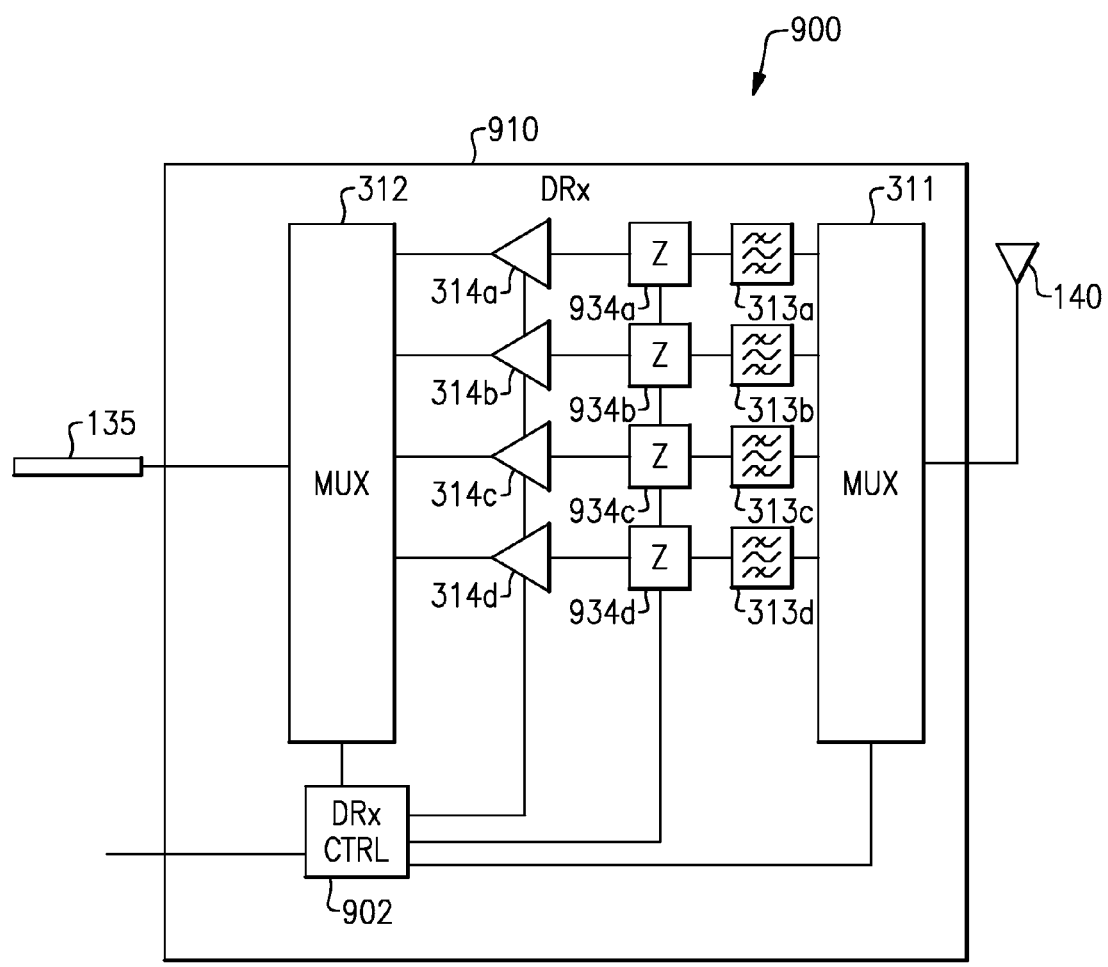
FIG. 9 shows that in some embodiments, a diversity receiver configuration may include a DRx module with tunable impedance matching components.

FIG. 9 shows that in some embodiments, a diversity receiver configuration 900 may include a DRx module 910 with tunable impedance matching components 934a-934d. Each of the tunable impedance matching components 934a-934d may be configured to present an impedance controlled by an impedance tuning signal received from a DRx controller 902.

The diversity receiver configuration 900 includes a DRx module 910 having an input coupled to an antenna 140 and an output coupled to a transmission line 135. The DRx module 910 includes a number of paths between the input and the output of the DRx module 910. In some implementations, the DRx module 910 includes one or more bypass paths (not shown) between the inputs and the output activated by one or more bypass switches controlled by the DRx controller 902.

The DRx module 910 includes a number of multiplexer paths including an input multiplexer 311 and an output multiplexer 312. The multiplexer paths include a number of on-module paths (shown) that include the input multiplexer 311, a bandpass filter 313a-313d, a tunable impedance matching component 934a-934d, an amplifier 314a-314d, and the output multiplexer 312. The multiplexer paths may include one or more off-module paths (not shown) as described above. As also described above, the amplifiers 314a-314d may be variable-gain amplifiers and/or variable-current amplifiers.

The tunable impedance matching components 934a-934b may be a tunable T-circuit, a tunable PI-circuit, or any other tunable matching circuit. The tunable impedance matching components 934a-934d may include one or more variable components, such as resistors, inductors, and capacitors. The variable components may be connected in parallel and/or in series and may be connected between the outputs of the input multiplexer 311 and the inputs of the amplifiers 314a-314d or may be connected between the outputs of the input multiplexer 311 and a ground voltage.

The DRx controller 902 is configured to selectively activate one or more of the plurality of paths between the input and the output. In some implementations, the DRx controller 902 is configured to selectively activate one or more of the plurality of paths based on a band select signal received by the DRx controller 902 (e.g., from a communications controller). The DRx controller 902 may selectively activate the paths by, for example, enabling or disabling the amplifiers 314a-314d, controlling the multiplexers 311, 312, or through other mechanisms as described above.

In some implementations, the DRx controller 902 is configured to tune the tunable impedance matching components 934a-934d. In some implementations, the DRx controller 702 tunes the tunable impedance matching components 934a-934d based on the band select signal. For example, the DRx controller 902 may tune the tunable impedance matching components 934a-934d based on a lookup table that associates frequency bands (or sets of frequency bands) indicated by the band select signal with tuning parameters. Accordingly, in response to a band select signal, the DRx controller 902 may transmit a impedance tuning signal to the tunable impedance matching component 934a-934d of each active path to tune the tunable impedance matching component (or the variable components thereof) according to the tuning parameters.

In some implementations, the DRx controller 902 tunes the tunable impedance matching components 934a-934d based, at least in part, on the amplifier control signals transmitted to control the gain and/or current of the amplifiers 314a-314d.

In some implementations, the DRx controller 902 is configured to tune the tunable impedance matching components 934a-934d of each active path such that the in-band noise figure is minimized (or reduced), the in-band gain is maximized (or increased), the out-of-band noise figure for each other active path is minimized (or reduced), and/or the out-of-band gain for each other active path is minimized (or reduced).

In some implementations, the DRx controller 902 is configured to tune the tunable impedance matching components 934a-934d of each active path such that the in-band metric (the in-band noise figure minus the in-band gain) is minimized (or reduced) and the out-of-band metric (the out-of-band noise figure plus the out-of-band gain) for each other active path is minimized (or reduced).

In some implementations, the DRx controller 902 is configured to tune the tunable impedance matching components 934a-934d of each active path such that in-band metric is minimized (or reduced) subject to a set of constraints and the out-of-band metric for each of the other active paths is minimized (or reduced) subject to the set of constraints and the additional constraints that the in-band metric not be increased by more than a threshold amount (e.g., 0.1 dB, 0.2 dB, 0.5 dB or any other value).

Thus, in some implementations, the DRx controller 902 is configured to tune the tunable impedance matching components 934a-934d of each active path such that the tunable impedance matching component reduces an in-band metric of the in-band noise figure minus the in-band gain to within a threshold amount of an in-band metric minimum, e.g., the minimum possible in-band metric subject to any constraints. The DRx controller 902 may be further configured to tune the tunable impedance matching components 934a-934d of each active path such that the tunable impedance matching component reduce an out-of-band metric of the out-of-band noise figure plus the out-of-band gain to an in-band-constrained out-of-band minimum, e.g., the minimum possible out-of-band metric subject to the additional constraint that the in-band metric not be increased by more than a threshold amount.

In some implementations, the DRx controller 902 is configured to tune the tunable impedance matching components 934a-934d of each active path such that a composite metric of the in-band metric (weighted by an in-band factor) plus the out-of-band metric for each of the other active paths (weighted by an out-of-band factor for each of the other active paths) is minimized (or reduced) subject to any constraints.

The DRx controller 902 may tune the variable components of the tunable impedance matching components 934a-934d to have different values for different sets of frequency bands.

In some implementations, the tunable impedance matching components 934a-934d are replaced with fixed impedance matching components that are not tunable or controlled by the DRx controller 902. Each one of the impedance matching components disposed along a corresponding one of the paths corresponding to one frequency band may be configured to reduce (or minimize) the in-band metric for the one frequency band and reduce (or minimize) the out-of-band metric for one or more of the other frequency bands (e.g., each of the other frequency bands).

For example, the third impedance matching component 934c may be fixed and configured to (1) reduce the in-band metric for the third frequency band, (2) reduce the out-of-band metric for the first frequency band, (3) reduce the out-of-band metric for the second frequency band, and/or (4) reduce the out-of-band metric of the fourth frequency band. The other impedance matching components may be similarly fixed and configured.

Thus, the DRx module 910 includes a DRx controller 902 configured to selectively one or more of a plurality of paths between an input of the DRx module 910 and an output of the DRx module 910. The DRx module 910 further includes plurality of amplifiers 314a-314d, each one of the plurality of amplifiers 314a-314d disposed along a corresponding one of the plurality of paths and configured to amplify a signal received at the amplifier. The DRx module further includes a plurality of impedance matching components 934a-934d, each one of the plurality of phase-shift components 934a-934d disposed along a corresponding one of the plurality of paths and configured to reduce at least one of an out-of-band noise figure or an out-of-band gain of the one of the plurality of paths.

In some implementations, the first impedance matching component 934a is disposed along a first path corresponding to a first frequency band (e.g., the frequency band of the first bandpass filter 313a) and is configured to reduce at least one of an out-of-band noise figure or an out-of-band gain for a second frequency band (e.g., the frequency band of the second bandpass filter 313b) corresponding to a second path.

In some implementations, the first impedance matching component 934a is further configured to reduce at least one of an out-of-band noise figure or an out-of-band gain for a third frequency band (e.g., the frequency band of the third bandpass filter 313c) corresponding to the third path.

Similarly, in some implementations, the second impedance matching component 934b disposed along the second path is configured to reduce at least one of an out-of-band noise figure or an out-of-band gain for the first frequency band.

Figure 10:
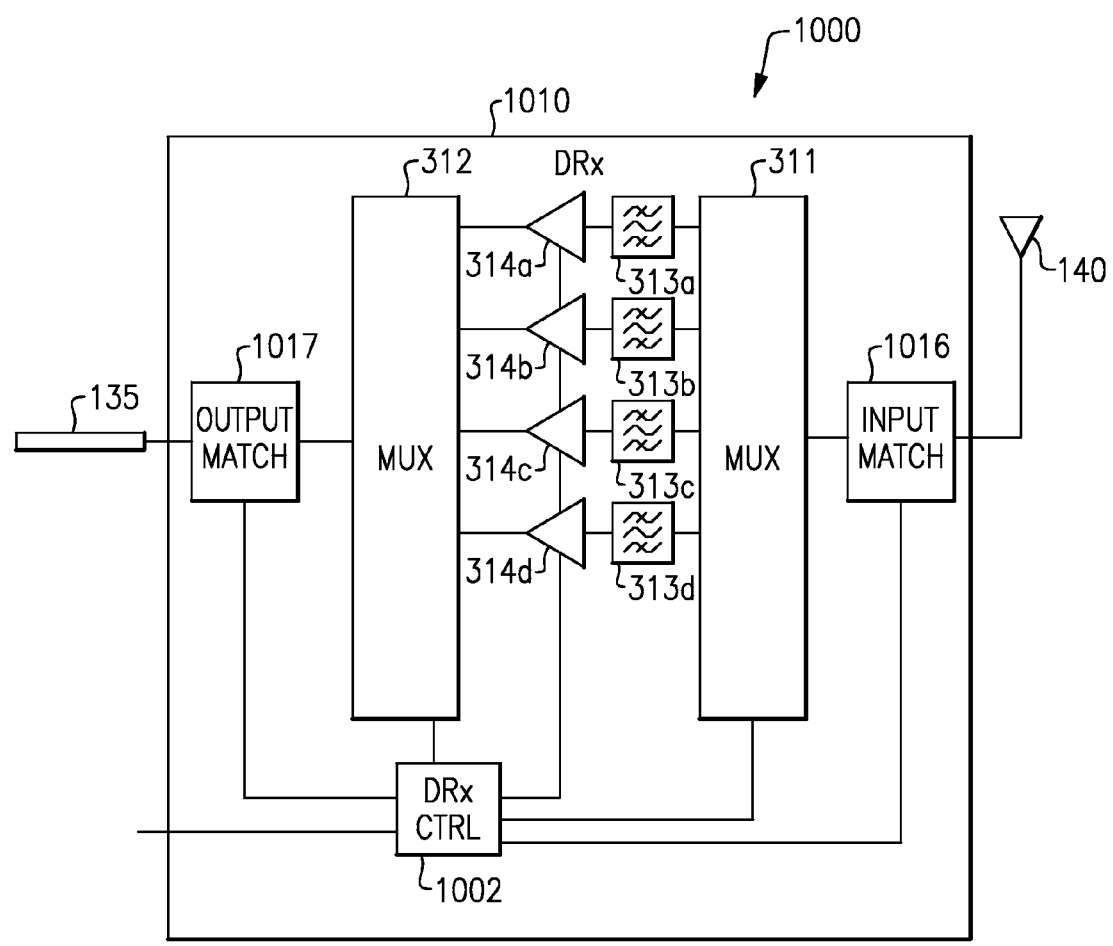
FIG. 10 shows that in some embodiments, a diversity receiver configuration may include a DRx module with tunable impedance matching components disposed at the input and output.

FIG. 10 shows that in some embodiments, a diversity receiver configuration 1000 may include a DRx module 1010 with tunable impedance matching components disposed at the input and output. The DRx module 1010 may include one or more tunable impedance matching components disposed at one or more of the input and the output of the DRx module 1010. In particular, the DRx module 1010 may include an input tunable impedance matching component 1016 disposed at the input of the DRx module 1010, an output tunable impedance matching component 1017 disposed at the output of the DRx module 1010, or both.

Multiple frequency bands received on the same diversity antenna 140 are unlikely to all see an ideal impedance match. To match each frequency band using a compact matching circuit, a tunable input impedance matching component 1016 may be implemented at the input of the DRx module 1010 and controlled by the DRx controller 1002 (e.g., based on a band select signal from a communications controller). For example, the DRx controller 1002 may tune the tunable input impedance matching component 1016 based on a lookup table that associates frequency bands (or sets of frequency bands) indicated by the band select signal with tuning parameters. Accordingly, in response to a band select signal, the DRx controller 1002 may transmit an input impedance tuning signal to the tunable input impedance matching component 1016 to tune the tunable input impedance matching component (or the variable components thereof) according to the tuning parameters.

The tunable input impedance matching component 1016 may be a tunable T-circuit, a tunable PI-circuit, or any other tunable matching circuit. In particular, the tunable input impedance matching component 1016 may include one or more variable components, such as resistors, inductors, and capacitors. The variable components may be connected in parallel and/or in series and may be connected between the input of the DRx module 1010 and the input of the first multiplexer 311 or may be connected between the input of the DRx module 1010 and a ground voltage.

Similarly, with only one transmission line 135 (or, at least, few transmission lines) carrying signals of many frequency bands, it is not likely that multiple frequency bands will all see an ideal impedance match. To match each frequency band using a compact matching circuit, a tunable output impedance matching component 1017 may be implemented at the output of the DRx module 1010 and controlled by the DRx controller 1002 (e.g., based on a band select signal from a communications controller). For example, the DRx controller 1002 may tune the tunable output impedance matching component 1017 based on a lookup table that associates frequency bands (or sets of frequency bands) indicated by the band select signal with tuning parameters. Accordingly, in response to a band select signal, the DRx controller 1002 may transmit an output impedance tuning signal to the tunable output impedance matching component 1017 to tune the tunable output impedance matching component (or the variable components thereof) according to the tuning parameters.

The tunable output impedance matching component 1017 may be a tunable T-circuit, a tunable PI-circuit, or any other tunable matching circuit. In particular, the tunable output impedance matching component 1017 may include one or more variable components, such as resistors, inductors, and capacitors. The variable components may be connected in parallel and/or in series and may be connected between the output of the second multiplexer 312 and the output of the DRx module 1010 or may be connected between the output of the second multiplexer 312 and a ground voltage.

Figure 11:
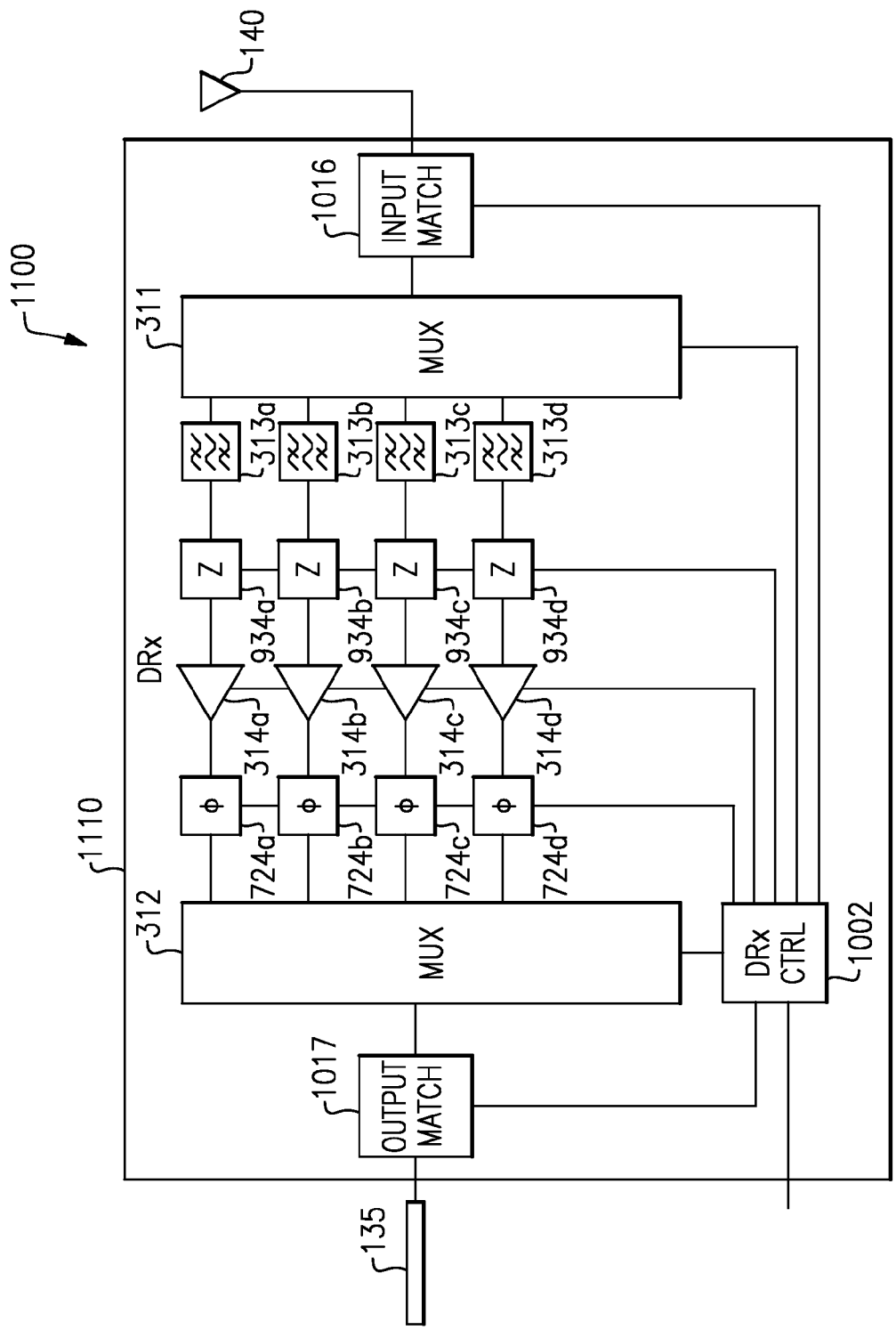
FIG. 11 shows that in some embodiments, a diversity receiver configuration may include a DRx module with multiple tunable components.

FIG. 11 shows that in some embodiments, a diversity receiver configuration 1100 may include a DRx module 1110 with multiple tunable components. The diversity receiver configuration 1100 includes a DRx module 1110 having an input coupled to an antenna 140 and an output coupled to a transmission line 135. The DRx module 1110 includes a number of paths between the input and the output of the DRx module 1110. In some implementations, the DRx module 1110 includes one or more bypass paths (not shown) between the inputs and the output activated by one or more bypass switches controlled by the DRx controller 1102.

The DRx module 1110 includes a number of multiplexer paths including an input multiplexer 311 and an output multiplexer 312. The multiplexer paths include a number of on-module paths (shown) that include a tunable input impedance matching component 1016, the input multiplexer 311, a band-pass filter 313a-313d, a tunable impedance matching component 934a-934d, an amplifier 314a-314d, a tunable phase-shift component 724a-724d, the output multiplexer 312, and a tunable output impedance matching component 1017. The multiplexer paths may include one or more off-module paths (not shown) as described above. As also described above, the amplifiers 314a-314d may be variable-gain amplifiers and/or variable-current amplifiers.

The DRx controller 1102 is configured to selectively activate one or more of the plurality of paths between the input and the output. In some implementations, the DRx controller 1102 is configured to selectively activate one or more of the plurality of paths based on a band select signal received by the DRx controller 1102 (e.g., from a communications controller). The DRx controller 902 may selectively activate the paths by, for example, enabling or disabling the amplifiers 314a-314d, controlling the multiplexers 311, 312, or through other mechanisms as described above. In some implementations, the DRx controller 1102 is configured to send an amplifier control signal to one or more amplifiers 314a-314d respectively disposed along the one or more activated paths. The amplifier control signal controls the gain (or current) of the amplifier to which it is sent.

The DRx controller 1102 is configured to tune one or more of the tunable input impedance matching component 1016, the tunable impedance matching components 934a-934d, the tunable phase-shift components 724a-724d, and the tunable output impedance matching component 1017. For example, the DRx controller 1102 may tune the tunable components based on a lookup table that associates frequency bands (or sets of frequency bands) indicated by the band select signal with tuning parameters. Accordingly, in response to a band select signal, the DRx controller 1101 may transmit a tuning signal to the tunable components (of active paths) to tune the tunable components (or the variable components thereof) according to the tuning parameters. In some implementations, the DRx controller 1102 tunes the tunable components based, at least in part, on the amplifier control signals transmitted to control the gain and/or current of the amplifiers 314a-314d. In various implementations, one or more of the tunable components may be replaced by fixed components that are not controlled by the DRx controller 1102.

It is to be appreciated that the tuning of one of the tunable components may affect the tuning of other tunable components. Thus, the tuning parameters in a lookup table for a first tunable component may be based on the tuning parameters for a second tunable component. For example, the tuning parameters for the tunable phase-shift components 724a-724d may be based on the tuning parameters for the tunable impedance matching components 934a-934d. As another example, the tuning parameters for the tunable impedance matching components 934a-934d may be based on the tuning parameters for the tunable input impedance matching component 1016.

Figure 12:
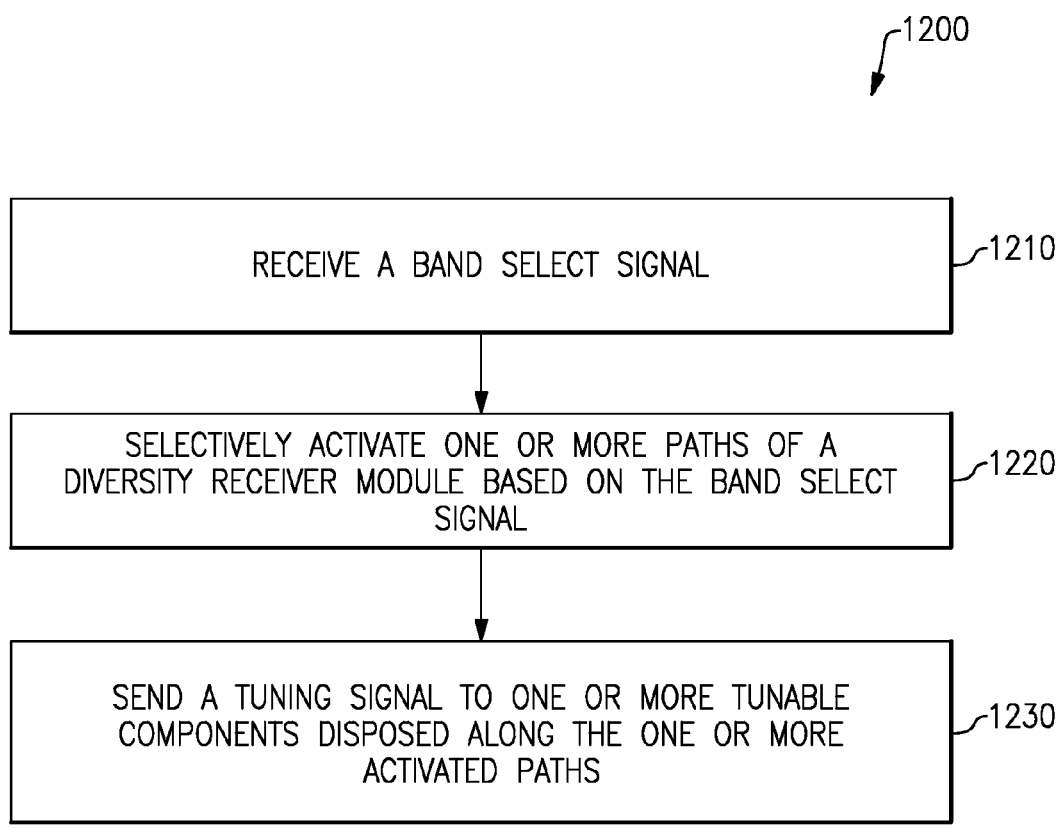
FIG. 12 shows an embodiment of a flowchart representation of a method of processing an RF signal.

FIG. 12 shows an embodiment of a flowchart representation of a method of processing an RF signal. In some implementations (and as detailed below as an example), the method 1200 is performed by a controller, such as the DRx controller 1102 of FIG. 11. In some implementations, the method 1200 is performed by processing logic, including hardware, firmware, software, or a combination thereof. In some implementations, the method 1200 is performed by a processor executing code stored in a non-transitory computer-readable medium (e.g., a memory). Briefly, the method 1200 includes receiving a band select signal and routing a received RF signal along one or more tuned paths to process the received RF signal.

The method 1200 begins, at block 1210, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block 1220, the controller selectively activates one or more paths of a diversity receiver (DRx) module based on the band select signal. As described above, a DRx module may include a number of paths between one or more inputs (coupled to one or more antennas) and one or more outputs (coupled to one or more transmission lines) of the DRx module. The paths may include bypass paths and multiplexer paths. The multiplexer paths may include on-module paths and off-module paths.

The controller may selectively activate one or more of the plurality of paths by, for example, opening or closing one or more bypass switches, enabling or disabling amplifiers disposed along the paths via an amplifier enable signal, controlling one or more multiplexers via a splitter control signal and/or a combiner control signal, or through other mechanisms. For example, the controller may open or close switches disposed along the paths or set the gain of the amplifiers disposed along the paths to substantially zero.

At block 1230, the controller sends a tuning signal to one or more tunable components disposed along the one or more activated paths. The tunable components may include one or more of a tunable impedance matching component disposed at the input of the DRx module, a plurality of tunable impedance matching components respectively disposed along the plurality of paths, a plurality of tunable phase-shift components respectively disposed along the plurality of paths, or a tunable output impedance matching component disposed at the output of the DRx module.

The controller may tune the tunable components based on a lookup table that associates frequency bands (or sets of frequency bands) indicated by the band select signal with tuning parameters. Accordingly, in response to a band select signal, the DRx controller may transmit a tuning signal to the tunable components (of active paths) to tune the tunable components (or the variable components thereof) according to the tuning parameters. In some implementations, the controller tunes the tunable components based, at least in part, on amplifier control signals transmitted to control the gain and/or current of one or more amplifiers respectively disposed along the one or more activated paths.

Figure 13:
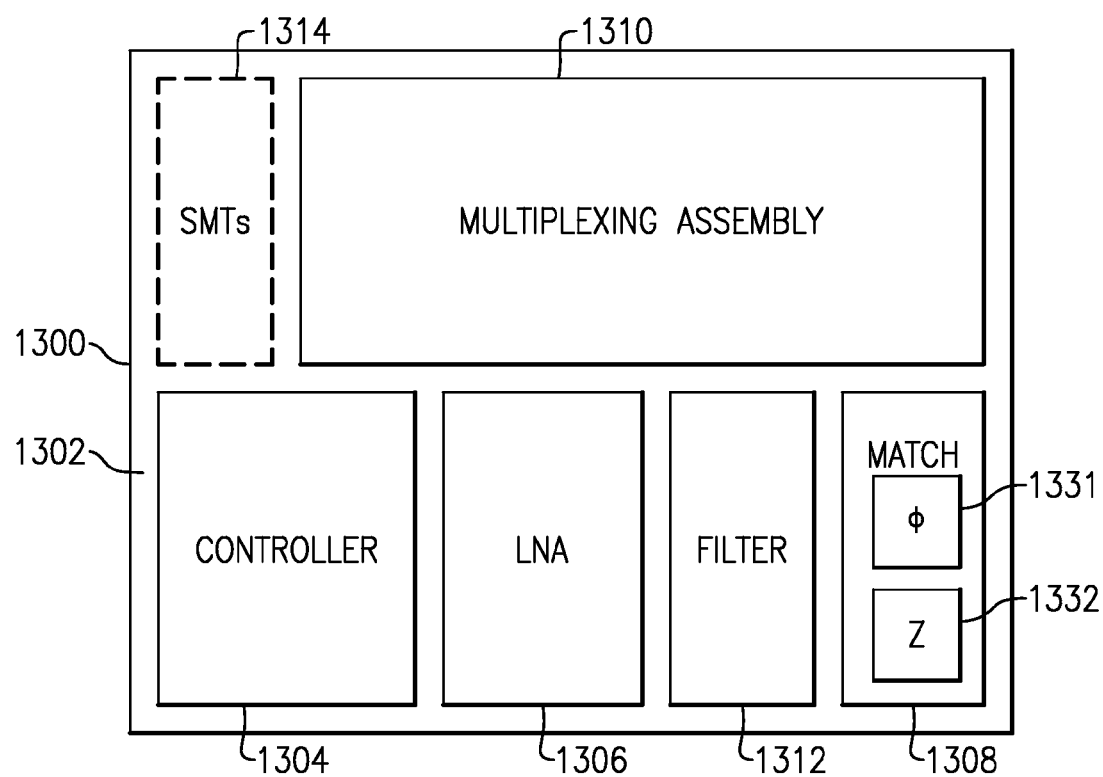
FIG. 13 depicts a module having one or more features as described herein.

FIG. 13 shows that in some embodiments, some or all of the diversity receiver configurations (e.g., those shown in FIGS. 3-11) can be implemented, wholly or partially, in a module. Such a module can be, for example, a front-end module (FEM). Such a module can be, for example, a diversity receiver (DRx) FEM. In the example of FIG. 13, a module 1300 can include a packaging substrate 1302, and a number of components can be mounted on such a packaging substrate 1302. For example, a controller 1304 (which may include a front-end power management integrated circuit [FE-PIMC]), a low-noise amplifier assembly 1306 (which may include one or more variable-gain amplifiers), a match component 1308 (which may include one or more fixed or tunable phase-shift components 1331 and one or more fixed or tunable impedance matching components 1332), a multiplexer assembly 1310, and a filter bank 1312 (which may include one or more bandpass filters) can be mounted and/or implemented on and/or within the packaging substrate 1302. Other components, such as a number of SMT devices 1314, can also be mounted on the packaging substrate 1302. Although all of the various components are depicted as being laid out on the packaging substrate 1302, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
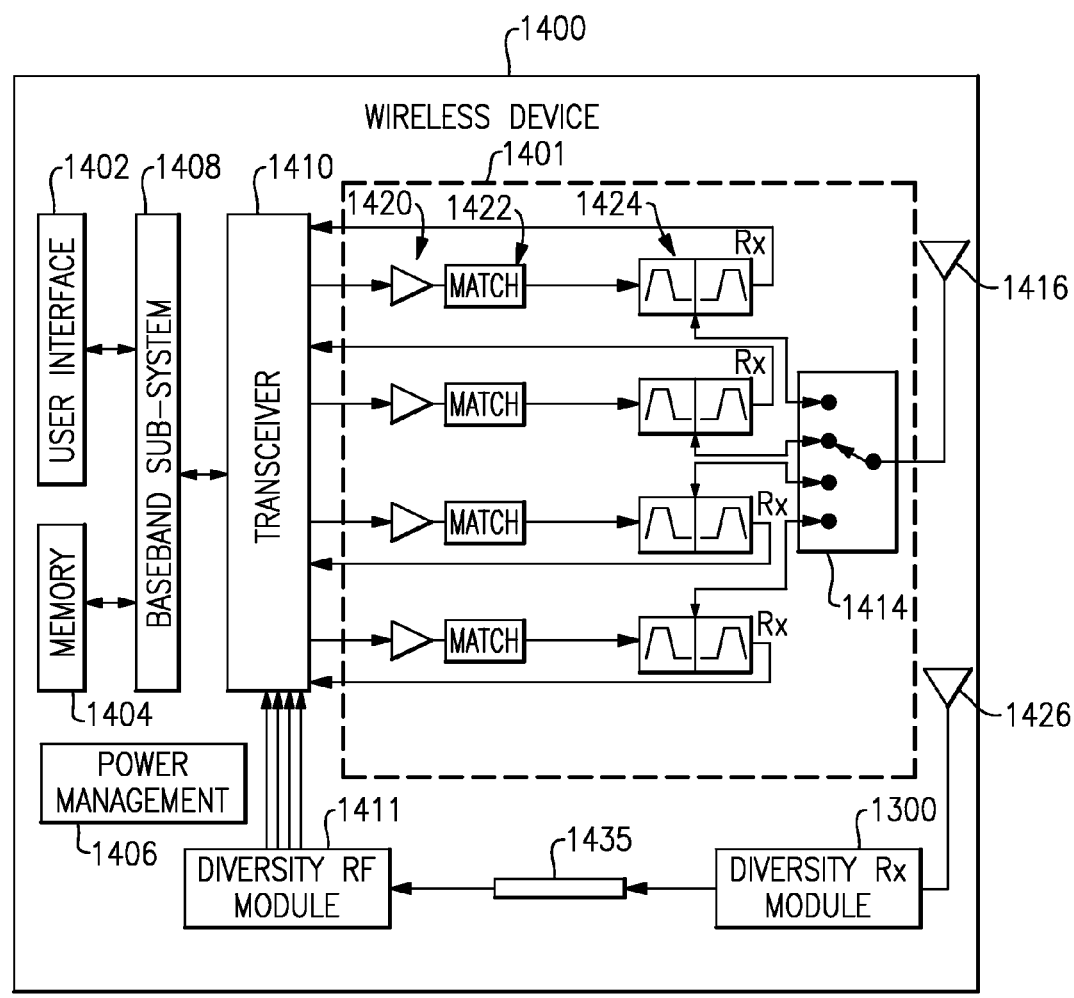
FIG. 14 depicts a wireless device having one or more features described herein.

FIG. 14 depicts an example wireless device 1400 having one or more advantageous features described herein. In the context of one or more modules having one or more features as described herein, such modules can be generally depicted by a dashed box 1401 (which can be implemented as, for example, a front-end module), a diversity RF module 1411 (which can be implemented as, for example, a downstream module), and a diversity receiver (DRx) module 1300 (which can be implemented as, for example, a front-end module)

Referring to FIG. 14, power amplifiers (PAs) 1420 can receive their respective RF signals from a transceiver 1410 that can be configured and operated in known manners to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 can also be in communication with a power management component 1406 that is configured to manage power for the operation of the wireless device 1400. Such power management can also control operations of the baseband sub-system 1408 and the modules 1401, 1411, and 1300.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example wireless device 1400, outputs of the PAs 1420 are shown to be matched (via respective match circuits 1422) and routed to their respective duplexers 1424. Such amplified and filtered signals can be routed to a primary antenna 1416 through an antenna switch 1414 for transmission. In some embodiments, the duplexers 1424 can allow transmit and receive operations to be performed simultaneously using a common antenna (e.g., primary antenna 1416). In FIG. 14, received signals are shown to be routed to "Rx" paths that can include, for example, a low-noise amplifier (LNA).

The wireless device also includes a diversity antenna 1426 and a diversity receiver module 1300 that receives signals from the diversity antenna 1426. The diversity receiver module 1300 processes the received signals and transmits the processed signals via a transmission line 1435 to a diversity RF module 1411 that further processes the signal before feeding the signal to the transceiver 1410.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A receiving system comprising:
a controller configured to selectively activate one or more of a plurality of paths between an input of the receiving system and an output of the receiving system;
a plurality of amplifiers, each one of the plurality of amplifiers disposed along a corresponding one of the plurality of paths and configured to amplify a signal received at the amplifier; and
a plurality of phase-shift components, each one of the plurality of phase-shift components disposed along a corresponding one of the plurality of paths and configured to phase-shift a signal passing through the phase-shift component, the plurality of phase-shift components including a first phase-shift component disposed along a first path of the plurality of paths corresponding to a first frequency band and configured to phase-shift a second frequency band of a signal passing through the first phase-shift component such that a second initial signal propagated along a second path of the plurality of paths corresponding to the second frequency band and a second reflected signal propagated along the first path are at least partially in-phase.

2. The receiving system of claim 1 wherein the plurality of phase-shift components includes a second phase-shift component disposed along the second path and configured to phase-shift the first frequency band of a signal passing through the second phase-shift component such that a first initial signal propagated along the first path and a first reflected signal propagated along the second path are at least partially in-phase.

3. The receiving system of claim 1 wherein the first phase-shift component is further configured to phase-shift a third frequency band of a signal passing through the first phase-shift component such that a third initial signal propagated along a third path of the plurality of paths corresponding to the third frequency band and a third reflected signal propagated along the first path are at least partially in-phase.

4. The receiving system of claim 1 wherein the first phase-shift component is configured to phase-shift the second frequency band of a signal passing through the first phase-shift component such that the second initial signal and the second reflected signal have a phase difference of an integer multiple of 360 degrees.

5. The receiving system of claim 1 further comprising a multiplexer configured to split an input signal received at the input into a plurality of signals at a respective plurality of frequency bands propagated along the plurality of paths.

6. The receiving system of claim 1 further comprising a signal combiner configured to combine signals propagating along the plurality of paths.

7. The receiving system of claim 6 further comprising a post-combiner amplifier disposed between the signal combiner and the output, the post-combiner amplifier configured to amplify a signal received at the post-combiner amplifier.

8. The receiving system of claim 6 wherein each one of the plurality of phase-shift components is disposed between the signal combiner and a respective one of the plurality of amplifiers.

9. The receiving system of claim 1 wherein at least one of the plurality of amplifiers includes a dual-stage amplifier.

10. The receiving system of claim 1 wherein at least one of the plurality of phase-shift components is a passive circuit.

11. The receiving system of claim 1 wherein at least one of the plurality of phase-shift components is an LC circuit.

12. The receiving system of claim 1 wherein at least one of the plurality of phase-shift components includes a tunable phase-shift component configured to phase-shift a signal passing through the tunable phase-shift component an amount controlled by a phase-shift tuning signal received from the controller.

13. The receiving system of claim 12 wherein the phase-shift tuning signal is based on a band select signal.

14. The receiving system of claim 1 further comprising a plurality of impedance matching components, each one of the impedance matching components disposed along a corresponding one of the plurality of paths and configured to decrease at least one of an out-of-band noise figure or an out-of-band gain of the corresponding one of the plurality of paths.

15. A radio-frequency (RF) module comprising:
a packaging substrate configured to receive a plurality of components; and
a receiving system implemented on the packaging substrate, the receiving system including a controller configured to selectively activate one or more of a plurality of paths between an input of the receiving system and an output of the receiving system, a plurality of amplifiers, each one of the plurality of amplifiers disposed along a corresponding one of the plurality of paths and configured to amplify a signal received at the amplifier, and a plurality of phase-shift components, each one of the plurality of phase-shift components disposed along a corresponding one of the plurality of paths and configured to phase-shift a signal passing through the phase-shift component, the plurality of phase-shift components includes a first phase-shift component disposed along a first path of the plurality of paths corresponding to a first frequency band and configured to phase-shift the second frequency band of a signal passing through the first phase-shift component such that a second initial signal propagated along a second path of the plurality of paths corresponding to the second frequency band and a second reflected signal propagated along the first path are at least partially in-phase.

16. The RF module of claim 15 wherein the RF module is a diversity receiver front-end module (FEM).

17. The RF module of claim 15 wherein the plurality of phase-shift components includes a second phase-shift component disposed along the second path and configured to phase-shift the first frequency band of a signal passing through the second phase-shift component such that a first initial signal propagated along the first path and a first reflected signal propagated along the second path are at least partially in-phase.

18. A wireless device comprising:
a first antenna configured to receive a first radio-frequency (RF) signal;
a first front-end module (FEM) in communication with the first antenna, the first FEM including a packaging substrate configured to receive a plurality of components, the first FEM further including a receiving system implemented on the packaging substrate, the receiving system including a controller configured to selectively activate one or more of a plurality of paths between an input of the receiving system and an output of the receiving system, a plurality of amplifiers, each one of the plurality of amplifiers disposed along a corresponding one of the plurality of paths and configured to amplify a signal received at the amplifier, and a plurality of phase-shift components, each one of the plurality of phase-shift components disposed along a corresponding one of the plurality of paths and configured to phase-shift a signal passing through the phase-shift component, a a first phase-shift component of the plurality of phase-shift components disposed along a first path of the plurality of paths corresponding to a first frequency band being configured to phase-shift the second frequency band of a signal passing through the first phase-shift component such that a second initial signal propagated along a second path of the plurality of paths corresponding to the second frequency band and a second reflected signal propagated along the first path are at least partially in-phase; and
a transceiver configured to receive a processed version of the first RF signal from the output via a transmission line and generate data bits based on the processed version of the first RF signal.

19. The wireless device of claim 18 further comprising a second antenna configured to receive a second radio-frequency (RF) signal and a second FEM in communication with the first antenna, the transceiver being configured to receive a processed version of the second RF signal from an output of the second FEM and generate the data bits based on the processed version of the second RF signal.

20. The wireless device of claim 18 wherein the plurality of phase-shift components includes a second phase-shift component disposed along the second path and configured to phase-shift the first frequency band of a signal passing through the second phase-shift component such that a first initial signal propagated along the first path and a first reflected signal propagated along the second path are at least partially in-phase.

* * * * *